(12) United States Patent
Lakhani et al.

(10) Patent No.: US 6,961,805 B2
(45) Date of Patent: **\*Nov. 1, 2005**

(54) MEMORY SYSTEM, METHOD AND PREDECODING CIRCUIT OPERABLE IN DIFFERENT MODES FOR SELECTIVELY ACCESSING MULTIPLE BLOCKS OF MEMORY CELLS FOR SIMULTANEOUS READING WRITING OR ERASURE

(75) Inventors: Vinod C. Lakhani, Milpitas, CA (US); Christophe J. Chevallier, Palo Alto, CA (US); Mathew L. Adsitt, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/341,068

(22) Filed: Jan. 13, 2003

(65) Prior Publication Data

US 2003/0126386 A1 Jul. 3, 2003

Related U.S. Application Data

(63) Continuation of application No. 09/496,759, filed on Feb. 3, 2000, now Pat. No. 6,507,885, which is a continuation of application No. 08/739,266, filed on Oct. 29, 1996, now Pat. No. 6,047,352.

(51) Int. Cl.[7] .............................................. G06F 12/00
(52) U.S. Cl. ........................ 711/5; 711/103; 365/230.06
(58) Field of Search ................ 711/5, 103; 365/230.06, 365/185.11, 185.29, 185.33

(56) References Cited

U.S. PATENT DOCUMENTS

| | | | |
|---|---|---|---|
| 4,642,798 A | 2/1987 | Rao ....................... | 365/230.06 |
| 5,418,752 A | 5/1995 | Harari et al. ............... | 365/218 |
| 5,430,859 A | 7/1995 | Norman et al. ............. | 711/103 |
| 5,473,563 A * | 12/1995 | Suh et al. ............... | 365/185.13 |
| 5,530,828 A | 6/1996 | Kaki et al. ................... | 711/103 |
| 5,541,886 A | 7/1996 | Hasbun ................. | 365/230.01 |
| 5,659,695 A | 8/1997 | Kelley et al. ................... | 711/5 |
| 5,680,362 A | 10/1997 | Parris et al. ........... | 365/230.01 |
| 5,706,233 A | 1/1998 | Ooishi ......................... | 365/201 |
| 5,749,088 A | 5/1998 | Brown et al. ............... | 711/115 |
| 5,822,252 A | 10/1998 | Lee et al. ................. | 365/185.3 |
| 5,841,721 A | 11/1998 | Kwon et al. ................. | 365/218 |
| 5,901,083 A | 5/1999 | Atsumi et al. ......... | 365/185.11 |
| 6,047,352 A | 4/2000 | Lakhani et al. ................ | 711/5 |
| 6,243,320 B1 | 6/2001 | Hamamoto et al. .... | 365/230.08 |
| 6,507,885 B2 * | 1/2003 | Lakhani et al. ................ | 711/5 |
| 2001/0000693 A1 | 5/2001 | Hamamoto et al ..... | 365/230.08 |

FOREIGN PATENT DOCUMENTS

| | | | | |
|---|---|---|---|---|
| JP | 2001-101899 | | 4/2001 | ........... G11C/29/00 |
| JP | 2001-236794 | | 8/2001 | ........... G11C/29/00 |

* cited by examiner

*Primary Examiner*—Christian P. Chace
(74) *Attorney, Agent, or Firm*—Schwegman, Lundberg, Woessner & Kluth, P.A.

(57) ABSTRACT

A memory system including a non-volatile flash memory and a method for simultaneously selecting a plurality of memory blocks are disclosed. The memory system is organized into multiple main blocks each having multiple smaller blocks, emulating a disk drive. Control lines activate a number of modes. In a first mode, high-order address lines select only one block, while in a second mode, user-specified multiple blocks are selected. Blocks are selected by loading registers with selection bits or by using some of the address lines directly as selection bits. Each bit specifies one of the blocks, and each bit is independent of the others. The memory system also includes a predecoder and a controller which controls the predecoder and the registers so as to select at least two blocks of memory cells. In a third mode, all of the blocks are selected, and in a fourth mode, all blocks are deselected. Selecting multiple blocks allows simultaneous erasing, writing, and reading of multiple bytes stored in the memory.

53 Claims, 9 Drawing Sheets

MEMORY SYSTEM, METHOD AND PREDECODING CIRCUIT OPERABLE IN DIFFERENT MODES FOR SELECTIVELY ACCESSING MULTIPLE BLOCKS OF MEMORY CELLS FOR SIMULTANEOUS READING WRITING OR ERASURE

This application is a continuation of U.S. Ser. No. 09/496,759 filed Feb. 3, 2000, now U.S. Pat. No. 6,507,885, which is a continuation of U.S. Ser. No. 08/739,266 filed Oct. 29, 1996, now issued as U.S. Pat. No. 6,047,352 on Apr. 4, 2000. These applications are incorporated herein by reference.

BACKGROUND OF THE INVENTION

1. Field of the Invention

The invention pertains to a memory system having an array of memory cells (e.g., a flash memory system which includes an array of flash memory cells and emulates a magnetic disk drive). More specifically, the invention pertains to a method and system for simultaneously selecting two or more blocks of cells of a memory cell array, so that data can be written to (or read from) the selected blocks simultaneously.

2. Description of Related Art

It is conventional to implement a memory system as an integrated circuit which includes an array of flash memory cells (or other non-volatile memory cells) and circuitry for independently erasing selected blocks of the cells, programming selected ones of the cells (i.e., writing data to selected ones of the cells), and reading data from selected ones of the cells. FIG. 1 is a simplified block diagram of a flash memory system (flash memory system 3) which is designed to emulate a magnetic disk drive system. Although system 3 can be implemented as a single integrated circuit, it is not necessarily implemented as a single integrated circuit, and the following description of system 3 will not assume that it is an integrated circuit.

As shown in FIG. 1, system 3 includes memory cell array 16 which comprises rows and columns of flash memory cells (each row of cells connected along a different wordline, and each column of cells connected along a different bitline), predecoding circuit or predecoder 49, row decoder circuit (X address decoder) 12, and Y-decoder circuit 13. Row decoder circuit 12 includes two physically separated sets of wordline drivers: a first set of wordline drivers 12A (positioned physically nearest to the bitline on the left side of array 16), and a second set of wordline drivers 12B (positioned physically nearest to the bitline on the right side of array 16).

The wordlines of array 16 will be referred to as being numbered consecutively from top to bottom of array 16, so that the wordlines are: wordline 0 (or "WL0"), wordline 1 (or "WL1"), wordline 2, . . . , wordline X–1, and wordline X (where X is an integer).

Typically, each memory cell is implemented by a floating-gate N-channel transistor. All the cells in a particular column have their drain regions connected to a common bitline (one of bitlines BL0 through BLN) and all the cells in a particular row have their control gates connected to a common wordline (one of wordlines WL0 through WLX). All of the cells have their sources connected to a common source line SL. Alternatively, it is possible to arrange the cells into array segments having separate source lines that can be sequentially accessed during an erase cycle (e.g., to reduce the maximum erase current).

The cells of array 16 are typically arranged in column pairs, with the cells of each pair sharing a common source region. The drain region of each cell is connected to the bitline (one of BL0 through BLN) associated with the column in which the cell is located.

The wordlines of array 16 are driven by two physically separated sets of wordline drivers: a first set of wordline drivers 12A (positioned physically nearest to bitline BL0 on the left side of the array), and a second set of wordline drivers 12B (positioned physically nearest to bitline BLN on the right side of the array). Each of the control gates of each of the cells connected along the even-numbered wordlines (wordlines WL0, WL2, etc.) is driven by a driver circuit within set 12A (i.e., each driver circuit within set 12A asserts an appropriate control voltage to each such control gate). Each of the control gates of each of the cells connected along the odd-numbered wordlines (wordlines WL1, WL3, etc.) is driven by a driver circuit within set 12B.

The drivers comprising set 12A are positioned along the left side of array 16 and are connected to the control gates of each of the flash memory cells of array 16 that are connected along the even-numbered wordlines of array 16, and the drivers comprising set 12B are positioned along the right side of array 16 and connected to the control gates of each of the cells connected along the odd-numbered wordlines of array 16. This arrangement of drivers 12A and 12B provides most efficient use of the area of system 3, allowing system 3 to be implemented with a smaller overall size than if all of drivers 12A and 12B were positioned on the same side of array 16.

In variations on system 3, array 16 is implemented so that each of two or more integrated circuits contains a different portion of array 16.

To enable a conventional flash memory system such as system 3 to implement the present invention, its predecoder circuit would need to be modified to become capable of asserting multiblock selection bits, so that in response to each set of multiblock selection bits, the system is capable of simultaneously selecting two or more selected blocks of cells of array 16 (in a manner to be explained below).

For convenience throughout this disclosure, we use the following notation to describe address bits. "A(Y:Z)" denotes a set of (Y–(Z–1)) address bits, consisting of binary bits $A_Y$, $A_{Y-1}$, $A_{Z+1}$, and $A_Z$. For example, A(8:0) denotes the following nine address bits: $A_8$, $A_7$, $A_6$, $A_5$, $A_4$, $A_3$, $A_2$, $A_1$, and $A_0$.

With reference again to FIG. 1, memory system 3 also includes control engine (or "controller") 29, output buffer 10, input buffer 11, and host interface 4. Host interface 4 asserts data from output buffer 10 (e.g., data read from array 16) to an external device (not shown), and asserts input data from the external device to input buffer 11 (so that such input data can be written to array 16). Alternatively, where host interface 4 includes input and output data buffers, buffers 10 and 11 can be eliminated and the data buffers within interface 4 used in place of them.

Host interface 4 also includes an address buffer for receiving external address bits from the external device, and is configured to send buffered address bits (including bits identifying cylinder, head, and sector addresses) to controller 29 in response to receiving external address bits from the external device. Host interface 4 also generates control signals in response to external control signals received from the external device and asserts the control signals to controller 29.

Where the external device is a host processor having a standard disk operating system (DOS) with a Personal Computer Memory Card International Association (PCMCIA)-AT Attachment (ATA) interface for communicating with a magnetic disk drive system, interface 4 should also comply with the PCMCIA-ATA standard so that it can communicate with the standard PCMCIA-ATA interface of the external device.

The column multiplexer (Y multiplexer) circuitry of system 3 comprises above-mentioned Y-decoder circuit 13, and one subset of Y Multiplexer circuitry for each main block of array 16 (e.g., circuit YMuxA for main block 16A, circuit YMuxB for main block 16B, and circuit YMuxJ for main block 16J).

In response to receiving the above-mentioned address bits (including bits identifying cylinder, head, and sector addresses) from interface 4, control engine 29 generates translated address bits A(22:0) and asserts the translated address bits to predecoding circuit ("predecoder") 49. In response to the translated address bits (and to control signals from control engine 29), predecoder 49 asserts wordline and bitline selection bits to row decoder 12 and Y decoder circuit 13. In response to the selection bits (and to below-discussed address bit AX and control signals from control engine 29), circuits 12 and 13 select cells of array 16 to which data is to be written or from which data is to be read.

For example, where address bits A18, A17, and A16 determine the erase block of the target cells (and where array 16 includes eight erase blocks per main block), predecoder 49 generates an 8-bit set of selection bits XC(7:0) (sometimes referred to as "erase block enable" bits) as follows, in response to each set of address bits A(18:16):

| A18 | A17 | A16 | XC(7:0) |
|-----|-----|-----|----------|
| 0 | 0 | 0 | 00000001 |
| 0 | 0 | 1 | 00000010 |
| 0 | 1 | 0 | 00000100 |
| 0 | 1 | 1 | 00001000 |
| 1 | 0 | 0 | 00010000 |
| 1 | 0 | 1 | 00100000 |
| 1 | 1 | 0 | 01000000 |
| 1 | 1 | 1 | 10000000 |

The single bit having value "one" in each set of selection bits XC(7:0) selects a different erase block (within a single selected main block). Bits XC(7:0) consist of XC0 which selects the first erase block, XC1 which selects the second erase block, XC2 which selects the third erase block, XC3 which selects the fourth erase block, XC4 which selects the fifth erase block, XC5 which selects the sixth erase block, XC6 which selects the seventh erase block, and XC7 which selects the eighth erase block.

Each of the cells (storage locations) of memory array circuit 16 is indexed by a row index (an "X" index determined by decoder circuit 12) and a column index (a "Y" index determined by Y decoder circuit 13). Each column of cells of array 16 comprises "X" memory cells (where X is an integer), with each cell implemented by a single floating-gate N-channel transistor.

In one embodiment in which array 16 includes ten main blocks (16A through 16J), each main block has 1024 rows of cells, each row has 4352 cells (and thus there are 4352 columns of cells), and array 16 includes a total of 4352× 10,240 cells. Each column of cells is connected along a single bitline, each column comprises 10,240 cells, and circuit 33 includes a set of eight sense amplifiers provided for reading eight cells in parallel (each cell connected along a different bitline). Each bitline extends through all ten main blocks.

In variations on the embodiment described in the previous paragraph, each column of cells consists of several groups of cells (with the cells in each group being connected along a different bitline) and each bitline is entirely within a main block (no bitline extends through more than one main block). In one such variation, for example, array 16 comprises 10,240 wordlines and 10×4352=43,520 bitlines (with 1024 cells connected along each bitline, 1024 rows per main block, and 4352 cells per row). Circuit 33 can include a separate set of sense amplifiers for reading each main block of cells (e.g., eighty sense amplifiers are provided within circuit 33, of which eight sense amplifiers are used to read eight cells of each main block in parallel, each of these cells being connected along a different bitline). Alternatively, circuit 33 could include one set of sense amplifiers (e.g., eight sense amplifiers for reading eight cells in parallel, each of these cells being connected along a different bitline), and multiplexing circuitry for coupling this set of sense amplifiers to bitlines in any selected one of the main blocks.

The drains of all transistors of a column are connected to a bitline, the control gate of each of the transistors is connected to a different wordline, and the sources of the transistors are held at a source potential (which is usually ground potential for the system during a read or programming operation). Each memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. Where each of the N-channel transistors is a flash memory device, the charge stored on the floating gate of each is erasable (and thus the data value stored by each cell is erasable) by appropriately changing the voltage applied to the gate and source (in a well known manner). In memory systems comprising an array of non-volatile memory cells other than flash memory cells, such nonvolatile cells are erased using other techniques which are well known.

As noted, system 3 emulates a conventional magnetic disk drive system. Accordingly, the cells of array 16 are addressed in a manner emulating the manner in which conventional magnetic disk storage locations are addressed. System 3 can be mounted on a card for insertion into a computer system. Alternatively, variations on system 3 (which lack array 16 and instead include a flash memory interface for interfacing with one or more separate memory array circuits) can be implemented as part of a card (for insertion into a computer system), where the card has a chip set mounted thereon, and the chip set includes a controller chip and several memory chips controlled by the controller chip. Each memory chip implements an array of flash memory cells.

The dominant computer operating system known as "DOS" (Disk Operating System) is essentially a software package used to manage a disk system. DOS has been developed by IBM Corporation, Microsoft Corporation, and Novell as the heart of widely used computer software. The first generation of the "Windows"® (trademark of Microsoft Corp.) operating system software was essentially a continuation of the original DOS software with a user friendly shell added for ease of use.

The DOS software was developed to support the physical characteristics of hard drive structures, supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system will support. In particular, a sector has come to mean 512 bytes of information for DOS and most other operating systems in existence. DOS also uses clusters as a storage unit. Clusters, however, are nothing more than the logical grouping of sectors to form a more efficient way of storing files and tracking them with less overhead.

The development of flash memory integrated circuits has enabled a new technology to offer competition to magnetic hard drives and offer advantages and capabilities that are hard to support by disk drive characteristics and features. The low power, high ruggedness, and small sizes offered by a solid state flash memory system make such a flash memory system attractive and able to compete with a magnetic hard disk drive system. Although a memory implemented with flash memory technology may be more costly than a hard disk drive system, computers and other processing systems are being developed that require (or benefit greatly from) use of flash memory features.

Thus, flash memory systems have been developed that emulate the storage characteristics of hard disk drives. Such a flash memory system is preferably structured to support storage in 512 byte blocks along with additional storage for overhead bits associated with mass storage, such as ECC (error correction code) bits. A key to this development is to make the flash memory array respond to a host processor in a manner that looks like a disk so the operating system can store and retrieve data in a known manner and be easily integrated into a computer system including the host processor.

In some flash memory systems that emulate the storage characteristics of hard disk drives, the interface to the flash memory is identical to a conventional interface to a conventional magnetic hard disk drive. This approach has been adopted by the PCMCIA standardization committee, which has promulgated a standard for supporting flash memory systems with a hard disk drive protocol. A flash memory card (including one or more flash memory array chips) whose interface meets this standard can be plugged into a host system having a standard DOS operating system with a PCMCIA-ATA (or standard ATA) interface. Such a flash memory card is designed to match the latter standard interface, but must include an onboard controller which manages each flash memory array independent of the host system.

Since system 3 of FIG. 1 emulates a magnetic disk drive, above-mentioned address bits A(22:0) determine cylinder, sector, and packet addresses of the type conventionally used in magnetic disk drive systems. In a preferred implementation, array 16 of FIG. 1 has 544 bytes per row of flash memory cells each byte consisting of eight bits, and each memory cell is capable of storing one bit). Each row of cells is equivalent to a magnetic disk "sector" (512 bytes of data plus 32 bytes of "overhead").

In such an implementation, array 16 is partitioned into ten large "decode" blocks (sometimes referred to as "main" blocks) of cells (schematically indicated in FIG. 1). The decode blocks are physically isolated from one another. This partitioning of blocks allows defects in one decode block to be isolated from the other decode blocks in the array, allows defective decode blocks to be bypassed by a controller, and allows for high usage of die and enhances overall yield of silicon produced (driving down the cost of flash mass storage systems).

Array 16 of FIG. 1 includes ten decode blocks (blocks 16A, 16B, 16C, 16D, 16E, 16F, 16G, 16H, 16I, and 16J, which are also referred to herein as "main blocks," and of which only blocks 16A, 16B, and 16J are shown in FIG. 1). Y-select gate circuitry is provided for each decode block of array 16. Specifically, Y-select gate circuitry YMuxA is provided for selecting columns of decode block 16A in response to indices received from circuit 13, Y-select gate circuitry YMuxB is provided for selecting columns of decode block 16B in response to indices received from circuit 13, Y-select gate circuitry YMuxJ is provided for selecting columns of decode block 16J in response to indices received from circuit 13, and seven other subsets of Y-select gate circuitry (not separately shown) are provided for selecting columns of the other decode blocks (blocks 16C, 16D, 16E, 16F, 16G, 16H, and 16I) in response to indices received from circuit 13.

Each decode block is subdivided into a number (e.g., eight) of independently erasable blocks, sometimes referred to herein as "erase blocks." In a preferred implementation of the FIG. 1 system, each erase block consists of rows of flash memory cells, each row being capable of storing seventeen "packets" of binary bits, each packet consisting of 32 bytes (each byte consisting of eight binary bits). Thus, each row (capable of storing 544 bytes) corresponds to one conventional disk sector (comprising 544 bytes), and each row can store 512 bytes of data of interest as well as 32 ECC bytes for use in error detection and correction (or 32 "overhead" bytes of some type other than ECC bytes, or a combination of ECC bytes and other overhead bytes).

Each erase block is divided into two blocks of cells known as "cylinders" of cells (in the sense that this expression is used in a conventional magnetic disk drive), with each cylinder consisting of 256K bits of data organized into 64 sectors (i.e. 64 rows of cells). Thus, each erase block in the preferred implementation of the FIG. 1 system consists of 128 sectors (i.e., 128 rows of cells).

Each erase block can be independently erased in response to control signals supplied from controller 29 to circuits 12 and 13. All flash memory cells in each erase block are erased at the same (or substantially the same) time, so that erasure of an erase block amounts to erasure of a large portion of array 16 at a single time.

The individual cells of array 16 of FIG. 1 are addressed by address bits A(22:0) and AX, with the four highest order address bits (A22, A21, A20, and A19) determining the main block, the three next highest order address bits (A18, A17, and A16) determining the erase block, the next address bit (A15) determining the cylinder, the next six address bits (A(14:9)) determining the sector, the next four address bits (A(8:5)) and bit AX determining the packet (within the sector), and the five lowest order address bits (A(4:0)) determining the byte within the packet. Address bits A(22:9) are used by predecoder 49 to generate selection bits which are processed by circuit 12 to select the row (sector) of array 16 in which the target byte is located, and the remaining nine address bits A(8:0) and bit AX are used by predecoder 49 to generate selection bits which are processed by Y decoder circuit 13 to select the appropriate columns of array 16 in which the target byte is located. In the preferred implementation, address bit AX is asserted (by controller 29) to predecoder 49 and is used by circuit 49 for selecting a packet consisting of overhead bits (such as ECC check bits and redundancy bits). More specifically, seventeen packets are stored per sector, including sixteen packets of ordinary data (any one of which can be selected by address bits A(8:5)) and one packet of overhead bits (which can be selected by address bit AX).

System 3 executes a write operation as follows. Control engine 29 asserts appropriate ones of address bits A(22:0) and AX to predecoder 49, and the selection bits output by predecoder 49 are asserted to decoder circuits 12 and 13. Control engine 29 also asserts appropriate control signals to other components of the system, including buffer 11 and circuits 12 and 13. In response to the selection bits, circuit 12 selects one sector (row) of cells and circuit 13 selects eight of the columns of memory cells of array 16. Address bits A(22:0) and AX thus together select a total of eight target cells in one selected row (for storing one byte of data). In response to a write command (a control signal) supplied from controller 29, a signal (indicative of an eight-bit byte of data) present at the output of input buffer 11 is asserted through the relevant Y multiplexer circuitry (e.g., through circuit YMuxJ, where the data is to be written to target cells in block 16J) to the eight target cells of array 16 determined by the row and column address (e.g., to the drain of each such cell). Depending on the value of each of the eight data bits, the corresponding target cell is either programmed or it remains in an erased state.

System 3 executes a read operation as follows. Control engine 29 asserts address bits A(22:0) and AX to predecoder 49, and the selection bits output by predecoder 49 are asserted to circuits 12 and 13. Control engine 29 also asserts appropriate control signals to other components of the system, including circuits 12 and 13. In response to the selection bits, circuit 12 selects one row (sector) of cells, and circuit 13 selects eight of the columns of memory cells of array 16. Address bits A(22:0) and AX thus together determine a total of eight target cells in one selected row (for reading one byte of data). In response to a read command (a control signal) supplied from control unit 29, a current signal (a "data signal") indicative of a data value stored in one of the eight target cells of array 16 is supplied from the drain of each of the target cells through the bitline of the target cell and then through the relevant Y multiplexer circuitry (e.g., through circuit YMuxJ, where the data is stored in cells within block 16J) to sense amplifier circuitry 33. Each data signal is processed in sense amplifier circuitry 33, buffered in output buffer 10, and finally asserted through host interface 4 to an external device.

Circuits 12, 13, 33, and the described Y multiplexer circuitry (including the YMuxA, YMuxB, and YMuxJ circuitry) are sometimes referred to herein collectively as "array interface circuitry."

System 3 also includes a pad (not shown) which receives a high voltage $V_{pp}$ from an external device, and a switch connected to this pad. During some steps of a typical erase or program sequence (in which cells of array 16 are erased or programmed), control unit 29 sends a control signal to the switch to cause the switch to close and thereby assert the high voltage $V_{pp}$ to various components of the system including wordline drivers within X decoder 12 (or the source line within array circuit 16.

When reading a selected cell of array 16, if the cell is in an erased state, the cell will conduct a first current which is converted to a first voltage in sense amplifier circuitry 33. If the cell is in a programmed state, it will conduct a second current which is converted to a second voltage in sense amplifier circuitry 33. Sense amplifier circuitry 33 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier circuitry 33 sends to output buffer 10.

It is important during a write operation to provide the wordline of each selected cell with the proper voltage and the drain of each selected cell with the appropriate voltage level (the voltage determined by the output of input buffer 11), in order to successfully write data to the cell without damaging the cell.

Controller 29 of system 3 controls detailed operations of system 3 such as the various individual steps necessary for carrying out programming, reading, and erasing operations. Controller 29 thus functions to reduce the overhead required of the external processor (not depicted) typically used in association with system 3.

It would be desirable to improve existing memory system technology to allow simultaneous selection of two or more blocks of cells (e.g., erase blocks or main blocks) of a memory cell array, in an efficient and controllable manner. This would allow manipulation of data in several blocks simultaneously (i.e., writing of data to, reading of data from, or erasing of several blocks simultaneously). This capability would be particularly useful during test mode operation of a memory system (e.g., a flash memory system) in order to reduce the time required to execute typical tests of memory cells of the system.

SUMMARY OF THE INVENTION

The memory system of the invention includes an array of memory cells (which are flash memory cells or other non-volatile memory cells in preferred embodiments), and a predecoding circuit operable in a mode in which it asserts multiblock selection bits (for selecting two or more blocks of the cells simultaneously) in response to control signals. Preferably, the predecoding circuit is operable in a selected one of a first mode in which it asserts single block selection bits in response to address bits (where each set of address bits determines one or more cells in a single block of the array) and a second mode in which it asserts multiblock selection bits in response to control signals. Preferably, the system includes registers in which at least some of the multiblock selection bits are stored, the predecoding circuit receives the stored multiblock selection bits from selected ones of the registers and asserts the received multiblock selection bits in response to specific control signals, and the system can replace the stored multiblock selection bits by loading replacement bits into each register at desired times.

In a write mode of a preferred embodiment of the system, each set of address bits is associated with a data byte to be written to cells in a single row of one block, each set of multiblock selection bits is associated with cells in a row of each of two or more blocks, and the system writes the same data byte to multiple sets of cells (each set of cells in a different block) in response to each set of multiblock selection bits. In a read mode of the preferred embodiment, each set of address bits identifies cells in a single row of one block from which a data byte is to be read, each set of multiblock selection bits identifies cells in a single row of each of two or more blocks from which a data byte is to be read, and the system reads data from multiple sets of cells (each set of cells in a different block) in response to each set of multi-block selection bits.

Preferably, the predecoding circuit asserts a selected one of several different sets of multiblock selection bits in response to each of several different sets of control signals. For example, where the memory array is organized into main blocks of cells, each main block consisting of erase blocks, and each erase block consisting of rows of cells, the predecoder is preferably controllable to assert one of: a set of multiblock selection bits which selects all erase blocks in a single main block, a second set of multiblock selection bits which selects the same erase block (or the same combination of two or more erase blocks) in all main blocks (or in any selected combination of two or more main blocks), a third set of multiblock selection bits which selects all the erase blocks in all the main blocks, and a fourth set of multiblock selection bits which selects any combination of erase blocks in one main block.

Preferably, the memory cells of the inventive system are flash memory cells. Other embodiments of the invention are methods implemented by any of the embodiments of the inventive system during operation.

The invention allows tests to be performed on memory cells more rapidly (by erasing multiple blocks of cells simultaneously) than such tests could be performed if blocks of the cells could only be erased sequentially. The step of erasing each block of cells is verytime-consuming, and thus it is useful to select multiple blocks of cells in accordance with the invention and to simultaneously erase the selected blocks.

DETAILED DESCRIPTION OF THE PREFERRED EMBODIMENTS

Figure 1:
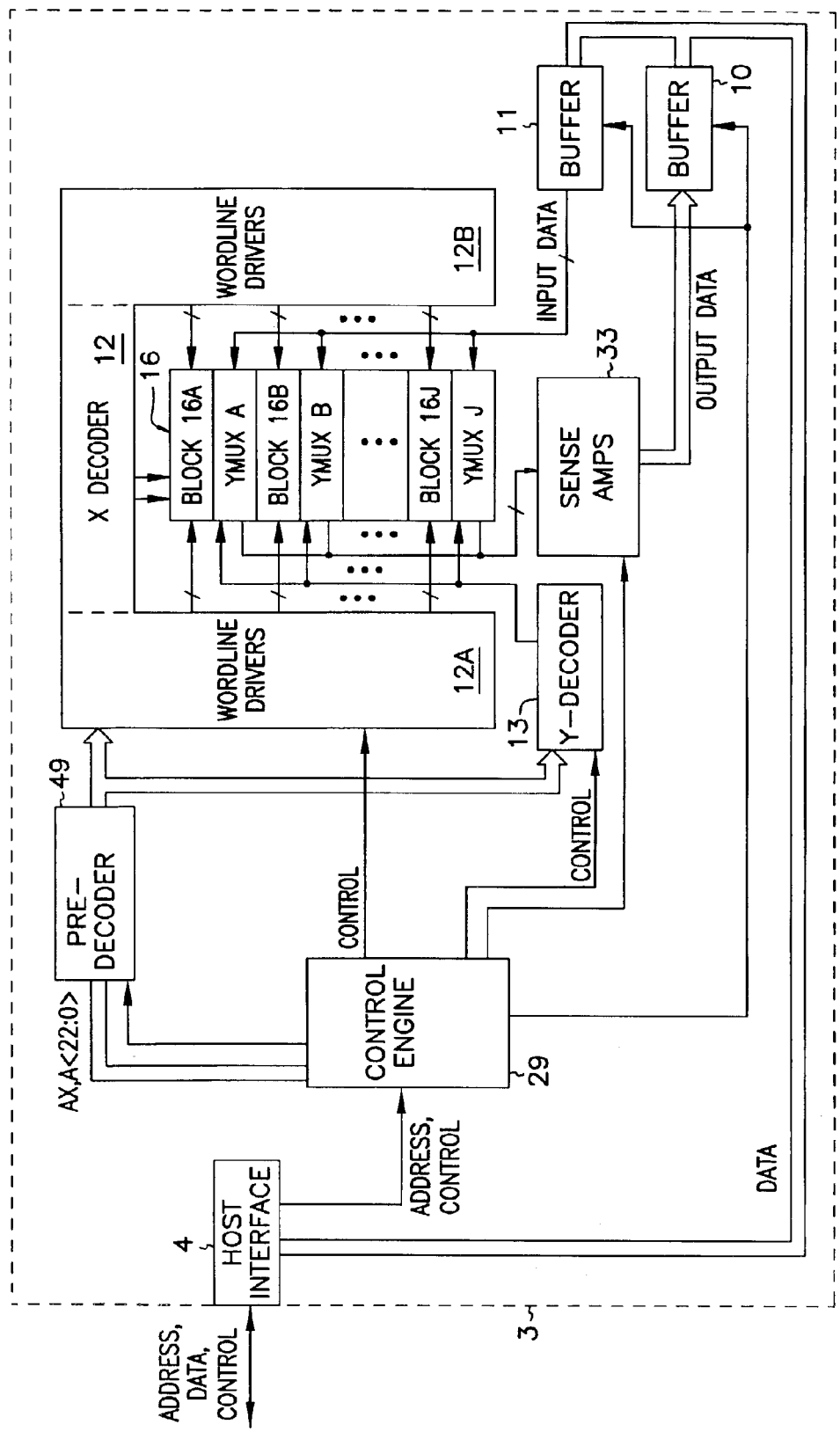
FIG. 1 is block diagram of a conventional nonvolatile (flash) memory system (implemented as an integrated circuit).

Throughout the disclosure, including in the claims, the term "block" (of memory cells) is used to denote a P-row subset of an N row×M column array of memory cells, where M, N, and P are integers, P is less than N, and each "row" and "column" is a one-dimensional (linear) array of cells. Thus, the term "block" assumes an N×M array consisting of cells organized in rows and columns, with a "block" of the cells being a P×M subset of the array. Typically, the cells will be connected along bitlines and wordlines, with each row of cells connected along a single wordline and each column of cells connected along a single bitline. However, the term "row" is not intended to be limited to denote an array of cells connected along a wordline, and the term "column" is not intended to be limited to denote an array of cells connected along a bitline.

Throughout the disclosure, including in the claims, the term "bits" (as in "multiblock selection bits") is used to denote signals indicative of bits of information (e.g., signals indicative of ones and zeros). For example, "multiblock selection bits" denotes signals indicative of a set of binary bits (or other bits of information), where the set of binary bits (or other bits of information) determines two or more selected blocks of memory cells.

A preferred embodiment of the system of the invention will be described with reference to FIGS. 2–8. One such embodiment is flash memory system 30 shown in FIG. 2 which includes array 16 of flash memory cells. Memory system 30 of FIG. 2 is identical to system 3 of FIG. 1, except in three respects: system 30 includes controller or control engine 129 (rather than controller 29 of FIG. 1); system 30 includes predecoder circuit 50 (rather than conventional predecoder 49 of FIG. 1); and system 30 includes registers 40 and 41. Controller 129 can be designed and programmed identically to controller 29 of FIG. 1, except that in accordance with the invention it has the additional capability to load registers 40 and 41 and to control predecoder 50 (in a manner to be explained below) to assert multiblock selection bits. In a preferred implementation, register 40 has capacity to store eight bits of data (bits E(7:0)) and can output these eight bits in parallel, and register 41 has capacity to store ten bits of data (bits M(9:0)) and can output these ten bits in parallel.

Figure 2:
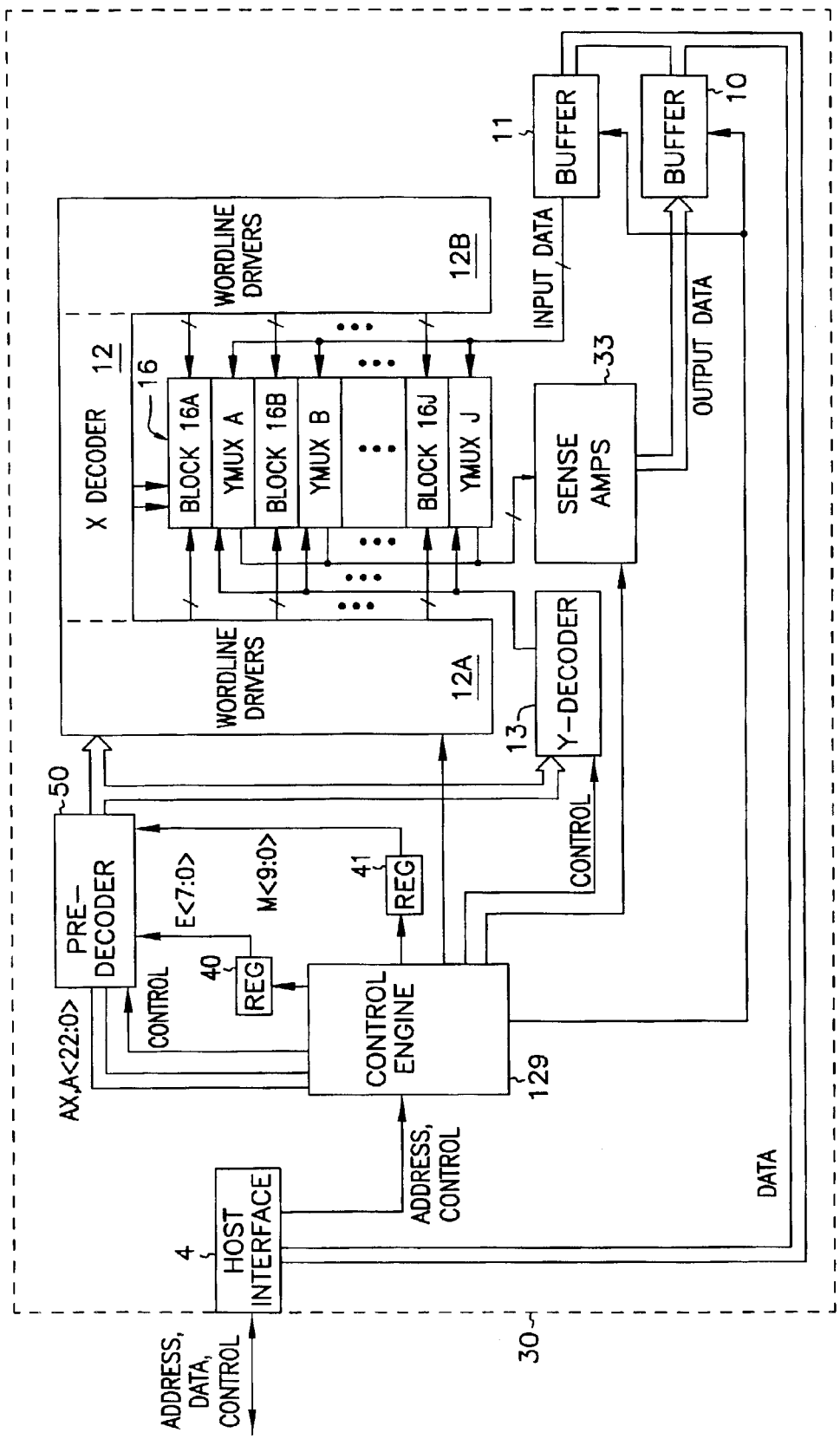
FIG. 2 is block diagram of a preferred embodiment of the inventive flash memory system (implemented as an integrated circuit).

Those elements of system 30 of FIG. 2 that are identical to corresponding elements of system 3 of FIG. 1 are identically numbered in FIGS. 1 and 2, and the foregoing description of them (with reference to FIG. 1) will not be repeated below. Although system 30 can be implemented as a single integrated circuit, it is not necessarily implemented as a single integrated circuit, and the following description of system 30 will not assume that it is an integrated circuit.

In a preferred implementation, array 16 of system 30 has capacity to store forty megabits of ordinary data (plus two and a half Megabits of overhead data), and includes ten main blocks (16A through 16J) as indicated in FIG. 2). Main blocks 16A through 16J are preferably organized in the same manner as are the above-described preferred implementations of blocks 16A through 16J of FIG. 1 (with a set of bitlines for each main block, of which none of the bitlines extend through more than one main block). In the preferred implementation, memory system 30 of FIG. 2 is designed to emulate a magnetic disk drive system (as is system 3 of FIG. 1), with each row of cells of array 16 corresponding to a sector of a magnetic disk drive system.

In an alternative implementation, array 16 of system 30 has capacity to store thirty-two Megabits of ordinary data (plus two Megabits of overhead data), and comprises only eight main blocks of the type described above with reference to the alternative implementation of system 3 of FIG. 1.

In the preferred implementation of system 30 of FIG. 2, array 16 has 544 bytes per row of flash memory cells. Each byte consists of eight bits, each memory cell is capable of storing one bit, each row of cells is equivalent to a magnetic disk "sector" (512 bytes of data plus 32 bytes of "overhead"), and the array is partitioned into ten main blocks of cells (16A through 16J). The main blocks are decode blocks (of the type mentioned above) and are physically isolated from one another. Each main block consists of 1024 rows of cells. Each row consists of 4352 cells connected along a common wordline. Each of the cells in a row is connected along a different bitline. Each row is capable of storing seventeen "packets" of bits, each packet consisting of 32 eight-bit bytes. Thus, each row (capable of storing 544 bytes) corresponds to one conventional magnetic disk sector (comprising 544 bytes). Each row can store 512 bytes of data of interest as well as 32 ECC bytes for use in error detection and correction (or 32 "overhead" bytes of some type other than ECC bytes, or a combination of ECC bytes and other overhead bytes).

Each main block is subdivided into eight independently erasable erase blocks. Each erase block consists of 128 of the described rows of flash memory cells, and thus has capacity to store 128×4352 bits. Each erase block is divided into two blocks of cells known as "cylinders" of cells, each cylinder having capacity to store 278,528 bits of data organized into 64 sectors (i.e. 64 rows).

The individual cells of the preferred implementation of array 16 (of FIG. 2) are addressed by address bits A(22:0) and AX, in the same manner as are the cells of the above-described preferred implementation of array 16 of FIG. 1. For example, in a write mode of a preferred embodiment of the FIG. 2 system (with predecoder 50 operating in a first mode in which it performs the same functions as predecoder 49 of FIG. 1), each set of address bits A(22:0) and AX is associated with a data byte to be written to cells in a single row of one erase block of one main block. In response to bits A(22:0) and AX, predecoder 50 (in its first mode of operation) asserts wordline and bitline selection bits to row decoder 12 and Y decoder circuit 13 (and circuits 12 and 13 then select the cells to which the data byte is to be written, in response to the selection bits).

An important advantage of the FIG. 2 system over the FIG. 1 system is that predecoder 50 is also operable in a second mode (rather than the first mode mentioned in the previous paragraph) in which predecoder 50 asserts multiblock selection bits to circuit 12. To enable the system to write a data byte simultaneously to two or more blocks (with predecoder 50 operating in its "second" mode), predecoder 50 asserts multiblock selection bits to row decoder circuit 12 and Y decoder circuit 13, and in response to the multiblock selection bits, circuits 12 and 13 select cells (in each of two or more blocks) to which the data byte is to be written. The system then writes the same data byte to multiple sets of selected cells (each set of selected cells in a different block).

The preferred embodiment of predecoder 50, to be described with reference to FIGS. 3–8, is designed to operate with the preferred implementation of array 16 which comprises ten main blocks of cells (each determined by address bits A(22:19)) and eight erase blocks within each main block (each erase block determined by address bits A(18:16)).

Figure 3:
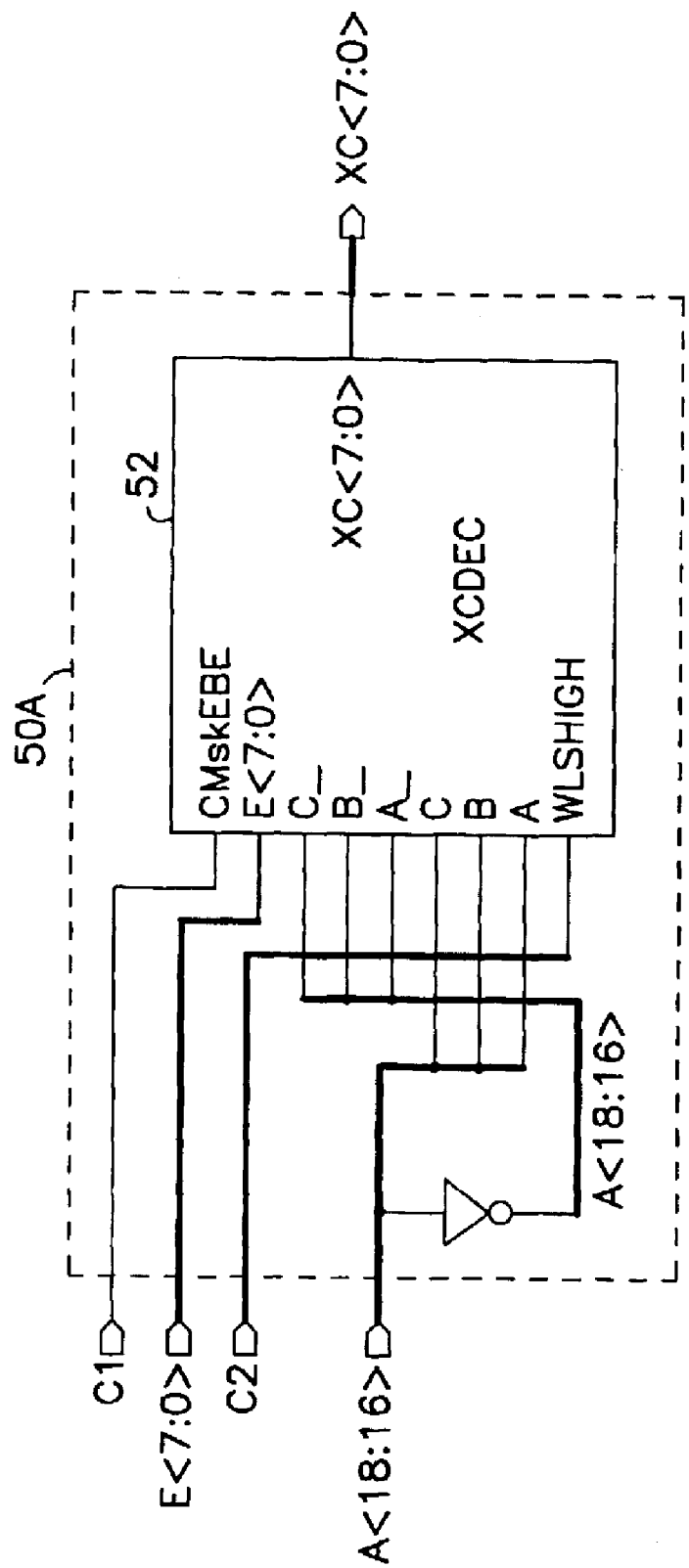
FIG. 3 is a block diagram of a portion of a preferred embodiment of predecoder 50 of FIG. 2.
Figure 4:
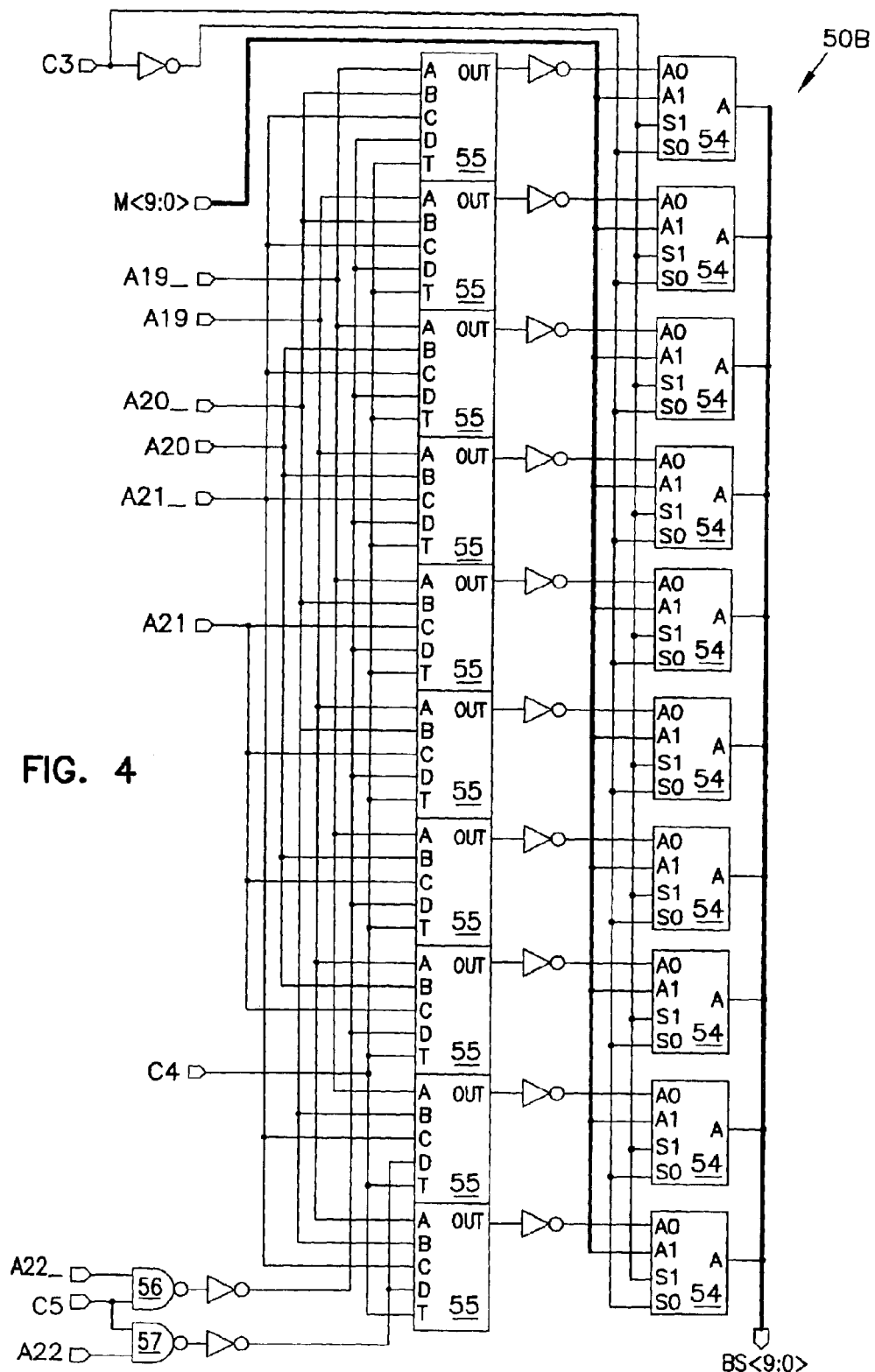
FIG. 4 is a block diagram of a second portion of the preferred embodiment of predecoder 50 of FIG. 2.

In this preferred embodiment, predecoder 50 includes erase block predecoder circuit 50A (shown in FIG. 3) and main block predecoder circuit SOB (shown in FIG. 4). Predecoder 50A operates in response to control signals C1 and C2 from controller 129 and address bits A (18:16) to assert in parallel at its output a set of eight selection bits XC (7:0), and is coupled to register 40 so that it can read an eight-bit set E (7:0) stored in register 40. Predecoder 50B operates in response to control signals C3, C4, and C5 from controller 129 and address bits A (22:19) to assert in parallel at its output a set of ten selection bits BS (9:0), and is coupled to register 41 so that it can read the ten-bit set M (9:0) stored in register 41.

Each of control signals C1 and C2 is a bit which controls operation of circuit 50A according to the following truth table (in which "x" denotes "don't care"):

TABLE A

| C1 | A18 | A17 | A16 | C2 | XC(7:0) |
|----|-----|-----|-----|----|---------|
| 0 | 0 | 0 | 0 | 0 | 00000001 |
| 0 | 0 | 0 | 1 | 0 | 00000010 |
| 0 | 0 | 1 | 0 | 0 | 00000100 |
| 0 | 0 | 1 | 1 | 0 | 00001000 |
| 0 | 1 | 0 | 0 | 0 | 00010000 |
| 0 | 1 | 0 | 1 | 0 | 00100000 |
| 0 | 1 | 1 | 0 | 0 | 01000000 |
| 0 | 1 | 1 | 1 | 0 | 10000000 |
| 1 | x | x | x | x | E(7:0) |
| 0 | x | x | x | 1 | 11111111 |

All the erase blocks (in each selected main block) can be taken low via the wordlines (i.e., all wordlines can be deselected, which effectively deselects all the erase blocks in each selected main block). If a main block is deselected, all the erase blocks in that main block are automatically deselected.

When predecoder 50A operates in a first mode (in response to each of control signals C1 and C2 having the value "0"), each set of bits XC(7:0) output therefrom is a set of single erase block selection bits (which selects only one erase block in each selected main block). In each such set of single erase block selection bits, the single bit having value "one" selects a different erase block (a single erase block within each selected main block) determined by the current values of address bits A(18:16).

When predecoder 50A operates in a second mode (in response to control signal C1 having the value "1", regardless of the value of C2), each set of bits XC(7:0) output from predecoder 50A is a set of block selection bits E(7:0) which has been retrieved from register 40 by predecoder 50A. If two or more bits of a set of bits E(7:0) have the value "1," then that set is a set of multiblock selection bits (in response to which the system selects two or more erase blocks in each selected main block). An example of such a set of multiblock selection bits is the following: E7=1, E6=1, E5=0, E4=0, E3=0, E2=0, E1=0, and E0=0. Control engine 129 preferably is capable of loading register 40 with bits E(7:0) having any possible combination of values.

When predecoder 50A operates in a third mode (in response to control signal C1 having the value "0" and control signal C2 having the value "1"), each set of bits XC(7:0) output from predecoder 50A is a set of multiblock selection bits XC7=1, XC6=1, XC5=1, XC4=1, XC3=1, XC2=1, XC1=1, and XC0=1. In response to this set, the system selects all eight erase blocks in each selected main block).

Predecoder SOB operates in response to control signals C3, C4 and C5 from controller 129, and in response to address bits A(22:19), to assert in parallel at its output a set of ten selection bits BS(9:0), and is coupled to register 41 so that it can read a ten-bit set M(9:0) stored in register 41.

Each of control signals C3, C4, and C5 is a bit which controls operation of circuit 50B according to the following truth table (in which "x" denotes "don't care"):

TABLE B

| C3 | A22 | A21 | A20 | A19 | C4 | C5 | BS(9:0) |
|----|-----|-----|-----|-----|----|----|---------|
| 0  | 0   | 0   | 0   | 0   | 0  | 1  | 0000000001 |
| 0  | 0   | 0   | 0   | 1   | 0  | 1  | 0000000010 |
| 0  | 0   | 0   | 1   | 0   | 0  | 1  | 0000000100 |
| 0  | 0   | 0   | 1   | 1   | 0  | 1  | 0000001000 |
| 0  | 0   | 1   | 0   | 0   | 0  | 1  | 0000010000 |
| 0  | 0   | 1   | 0   | 1   | 0  | 1  | 0000100000 |
| 0  | 0   | 1   | 1   | 0   | 0  | 1  | 0001000000 |
| 0  | 0   | 1   | 1   | 1   | 0  | 1  | 0010000000 |
| 0  | 1   | 0   | 0   | 0   | 0  | 1  | 0100000000 |
| 0  | 1   | 0   | 0   | 1   | 0  | 1  | 1000000000 |
| 1  | x   | x   | x   | x   | x  | x  | M(9:0) |
| 0  | x   | x   | x   | x   | 1  | x  | 1111111111 |
| 0  | x   | x   | x   | x   | 0  | 0  | 0000000000 |

When predecoder 50B operates in a first mode (in response to each of control signals C3 and C4 having the value "0" and control signal C5 having the value "1"), each set of bits BS(9:0) output from predecoder 50B is a set of single block selection bits (which selects only one main block). In each such set of single block selection bits, the single bit having value "one" selects a different main block determined by the current values of address bits A(22:19).

When predecoder 50B operates in a second mode (in response to control signal C3 having the value "1", regardless of the values of C4 and C5) each set of bits BS(9:0) output from predecoder 50B is a set of block selection bits M(9:0) which has been retrieved from register 41 by predecoder 50B. If two or more bits of a set of bits M(9:0) have the value "1," then that set is a set of multiblock selection bits (in response to which the system selects two or more main blocks of cell array 16). An example of such a set of multiblock selection bits is the following: M9=1, M8=1, M7=0, M6=0, M5=0, M4=0, M3=0, M2=0, M1=0, and M0=0. Control engine 129 preferably is capable of loading register 41 with bits M(9:0) having any possible combination of values.

When predecoder 50B operates in a third mode (in response to control signal C3 having the value "0" and control signal C4 having the value "1"), each set of bits BS(9:0) output from predecoder 50B is a set of multiblock selection bits BS9=1, BS8=1, BS7=1, BS6=1, BS5=1, BS4=1, BS3=1, BS2=1, BS1=1, and BS0=1. In response to this set, the system selects all ten main blocks.

When predecoder 50B operates in a fourth mode (in response to all three of the control signals C3, C4, and C5 having the value "0"), each set of bits BS(9:0) output from predecoder 50B is a set of deselection bits BS9=0, BS8=0, BS7=0, BS6=0, BS5=0, BS4=, BS3=0, BS2=0, BS1=0, and BS0=0. In response to this set, the system does not select any of the main blocks (and thus, no data can be written to or read from array 16).

In the described embodiment, array 16 has eighty erase blocks, but registers 40 and 41 store only eighteen bits. These eighteen bits can be routed through predecoder 50 for use in simultaneously selecting any desired combination of erase blocks (i.e., any selected set of two or more of the erase blocks). More generally, preferred embodiments of the invention include an array comprising N erase blocks, and M registers coupled to a predecoder wherein the registers store a total of no more than X multiblock selection bits, where N, M, and x are integers, and X is less than N. For example, N can equal 80, M can equal one (or two), and X can equal eight, ten, or eighteen.

U.S. patent application Ser. No. 08/563,505, filed Nov. 28, 1995, now U.S. Pat. No. 5,615,159 (and assigned to the assignee of the present application), describes a method and apparatus for storing control bits in registers (of a type which can be used to implement registers 40 and 41) and for using such registers to store control bits so that the control bits are accessible to address bit processing circuitry which selectively inverts address bits. The text of U.S. patent application Ser. No. 08/563,505, now U.S. Pat. No. 5,615,159 is incorporated herein by reference.

In another class of embodiments, registers 40 and 41 are implemented as volatile memories (with register 40 capable of storing eight bits in volatile fashion, and register 41 capable of storing ten bits in volatile fashion). In such embodiments, each register preferably includes a decoding circuit which receives register control bits from control engine 129 and generates write control bits (or read control bits) from the register control bits, and latch circuitry. The latch circuitry receives the write control bits from the decoding circuit, temporarily stores a set of input data bits (a set of eight bits E(7:0) in the case of register 40, and a set of ten bits M(9:0) in the case of register 41) in response to the write control bits, and asserts the set of stored data bits to predecoder 50 (predecoder 50 uses the bits asserted by the latch circuitry in some but not all of its modes of operation). In response to the read control bits, the latch circuitry also asserts the data bits stored therein to output buffer 10, from which they can be asserted to an external drive through interface 4.

In a class of preferred embodiments (useful only for implementing simultaneous erasures of multiple blocks; not simultaneous writes to or reads from multiple blocks), registers 40 and 41 are not included in the inventive memory system (or are not used if they are included). One such embodiment is that shown in FIG. 9 (to be described below). Rather, control engine 129 asserts bits E(7:0) directly to predecoder 50 in place of address bits A(17:10). In response, predecoder 50 asserts bits E(7:0) to decoder 12 (rather than block selection bits generated by processing address bits A(18:16)). Or, control engine 129 asserts bits M(9:0) directly to predecoder 50 in place of address bits A(9:0) and in response, predecoder 50 asserts bits M(9:0) to decoder 12 (rather than block selection bits generated by processing address bits A(22:19)). Preferably, control engine 129 asserts both bits M(9:0) and E(7:0) to predecoder 50 in place of address bits A(17:0), and predecoder 50 asserts all of them to decoder 12.

Figure 5:
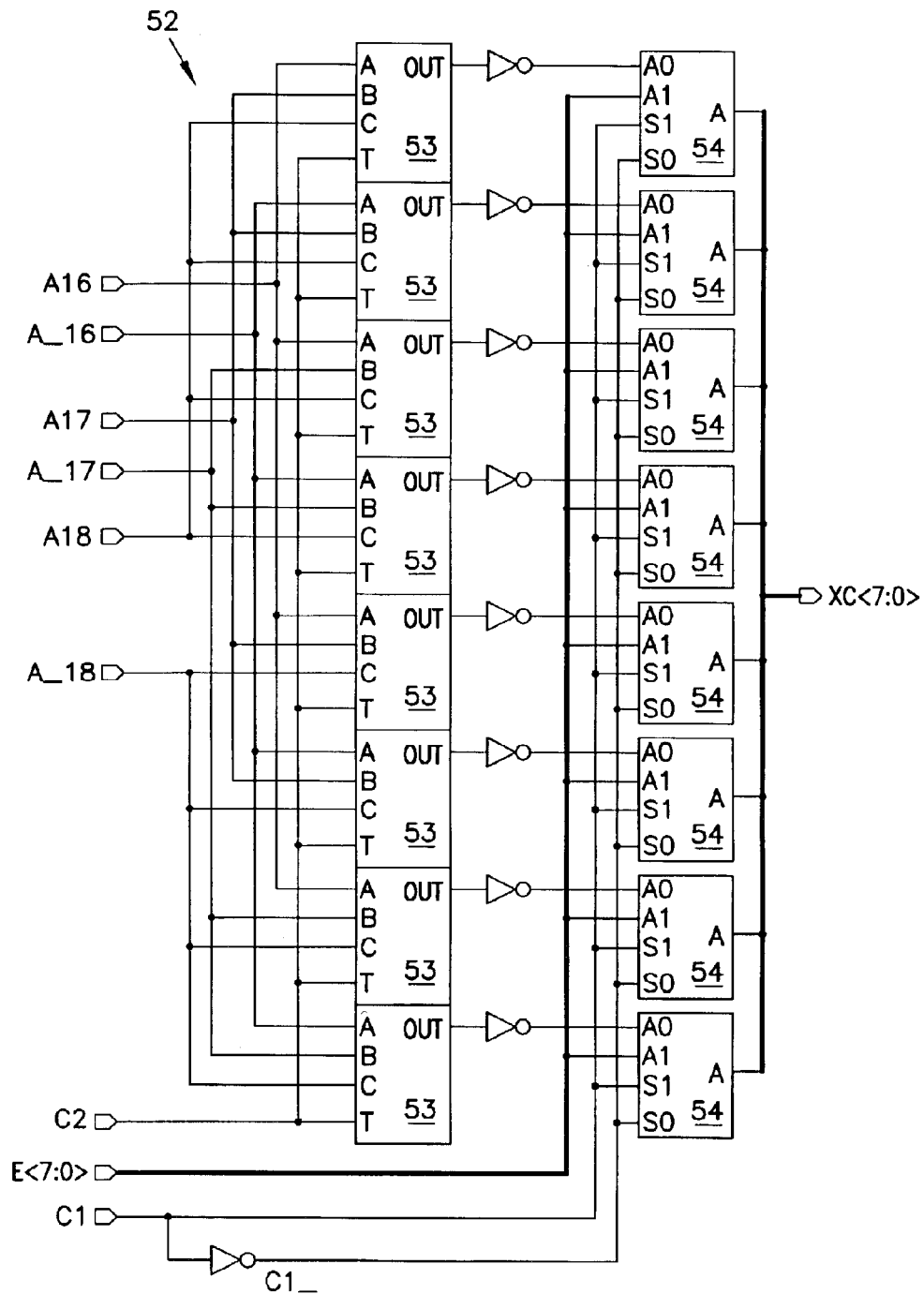
FIG. 5 is a block diagram of the decoder portion (XCDEC circuit 52) of the FIG. 3 circuit.

FIG. 3 is a diagram of a preferred embodiment of portion 50A of predecoder 50 of FIG. 2. FIG. 5 is a diagram of a preferred implementation of decoder circuit 52 (also denoted as the "XCDEC" circuit) of the preferred embodiment of circuit 50A. As shown in FIG. 5 (and in FIG. 3), the preferred embodiment of predecoder 50A includes eight identical gate circuits 53 connected as shown, and eight identical multiplexer circuits 54 connected as shown. Each of circuits 53 receives control bit C2 and three of address bits A(18:16) and the inverses of such address bits, and operates in response thereto (in a manner to be described with reference to FIG. 6, which is a diagram of a preferred implementation of circuit 53). More specifically, the top circuit 53 in FIG. 5 receives bits A18, A17, and A16, the next circuit 53 from the top (in FIG. 5) receives bits A18, A17, and A__16, the next circuit 53 from the top receives bits A18, A__17, and A16, the next circuit 53 from the top receives bits A18, A__17, and A__16, the next circuit 53 from the top receives bits A__18, A17, and A16, the next circuit 53 from the top receives bits A__18, A17, and A__16, the next circuit 53 from the top receives bits A__18, A__17, and A16, and circuit 53 at the bottom of FIG. 5 receives bits A__18, A__17, and A__16.

Each of circuits 54 receives the inverted output of a corresponding one of circuits 53 (at its "A0" terminal), and receives a different one the bits E(7:0) from register 40 (at its "A1" terminal), and outputs a selected one of these two input bits in response to control bit C1 (and the inverse of bit C1) in a manner to be described with reference to FIG. 8. When the FIG. 5 circuit is controlled to output the bits E(7:0) by passing them through circuits 54, the FIG. 5 circuit effectively reads the bits E(7:0) from register 40 and asserts them to the array interface circuitry of the system (which includes circuits 12 and 13 and Y multiplexer circuits YMuxA through YMuxJ).

Figure 8:
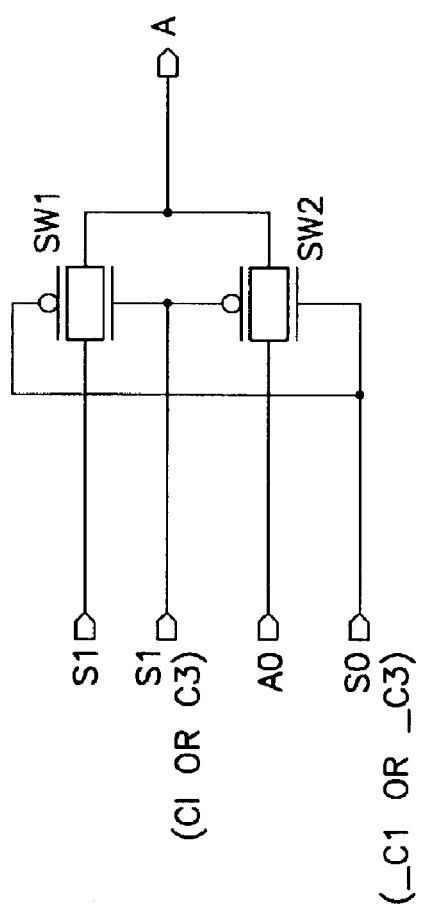
FIG. 8 is a schematic diagram of multiplexer circuit 54 (AMUX) used in both the FIG. 3 circuit and the FIG. 4 circuit.

As shown in FIG. 8, each multiplexer circuit 54 includes two pass transistor switches SW1 and SW2. Each of pass transistor switches SW1 and SW2 consists of a PMOS transistor and an NMOS transistor connected as shown. In response to assertion of control bit C1 with a high value to the control gate of the NMOS transistor of SW1 and the control gate of the PMOS transistor of SW2 (and assertion of inverse C1_of bit C1 with a low value to the control gate of the PMOS transistor of SW1 and the control gate of the NMOS transistor of SW2), switch SW2 is in an open state (preventing assertion of the inverted output of the corresponding circuit 53 to output terminal A) and switch SW1 is in a closed state (so that it passes the relevant one of bits E(7:0) received at input terminal A1 through to output terminal A). In response to assertion of control bit C1 with a low value to the control gate of the NMOS transistor of SW1 and the control gate of the PMOS transistor of SW2 (and assertion of C1_with a high value to the control gate of the PMOS transistor of SW1 and the control gate of the NMOS transistor of SW2), switch SW2 is in a closed state (so that it passes the inverted output of the corresponding circuit 53 through to output terminal A) and switch SW1 is in an open state (preventing assertion of the relevant one of bits E(7:0) to output terminal A). Control bits C1 and C1_are received, respectively, at terminals S1 and S0 of each FIG. 8 circuit embodying one of circuits 54 of FIG. 5.

Figure 6:
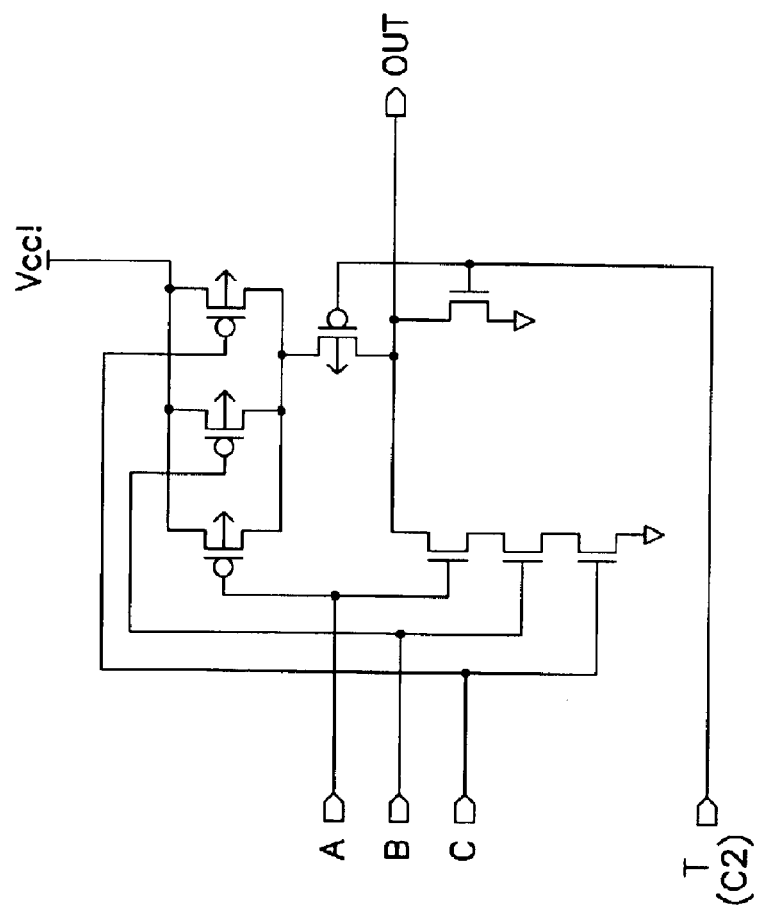
FIG. 6 is a schematic diagram of gate circuit 53 (CGATE2) of the FIG. 5 circuit.

With reference to FIGS. 5 and 6, each circuit 53 receives address bit A18 (or its inverse A_18) at its "C" terminal, address bit A17 (or its inverse A_17) at its "B" terminal, address bit A16 (or its inverse A_16) at its "A" terminal, and control bit C2 at its "T" terminal. The FIG. 6 implementation of each circuit 53 consists of eight transistors connected as shown in FIG. 6. When C2 is low (and C1 is also low), circuits 53 assert at their "Output" terminals the inverses of the output bits XC(7:0) which are specified in one of the first eight rows of Table A (each circuit 53 asserts a different one of the inverted bits XC(7:0) in the row of Table A determined by the values of bits A(18:16)). As mentioned above, when control bit C1 is low (while C2 is low), the inverses of the outputs of circuits 53 pass through multiplexers 54, and thus the output bits XC(7:0) of circuit 52 are the bits specified in one of the first eight rows of Table A (where the row is determined by the values of bits A(18:16)).

When control bit C2 is high, the output of each of circuits 53 is grounded (i.e., has a low level). As mentioned above, when control bit C1 is low (while C2 is high), the inverses of the outputs of circuits 53 pass through multiplexers 54, and thus the output bits XC(7:0) of circuit 52 all have a high value.

FIG. 4 is a block diagram of a preferred implementation of portion 503 of predecoder 50 of FIG. 2. As shown in FIG. 4, predecoder 50B operates in response to control signals C3, C4, and C5 from controller 129, address bits A(22:19), and the inverses A_(22:19) of these address bits, to assert in parallel at its output a set of ten selection bits BS(9:0). The FIG. 4 embodiment of circuit 50B is also coupled to register 41 so that it can read the ten-bit set M(9:0) stored in register 41.

As shown in FIG. 4, the preferred embodiment of predecoder 50B includes ten identical gate circuits 55 connected as shown, ten identical multiplexer circuits 54 connected as shown, and NAND gates 56 and 57 connected as shown. Each of circuits 55 receives control bit C4 and four bits selected from the set of address bits A(21:19), the inverses of such address bits, and the inverted outputs of NAND gates 56 and 57, and operates in response thereto (in a manner to be described with reference to FIG. 7, which is a diagram of a preferred implementation of circuit 55). More specifically, the two inputs to NAND gate 56 are address bit A22 and control bit C5, and the two inputs to NAND gate 57 are inverted address bit A_22 and control bit C5. Thus, the inverted output of gate 56 is a logical AND of A22 and C5, and the inverted output of gate 57 is a logical AND of A_22 and C5. The circuit 55 at the left side of FIG. 4 receives bits A_19, A_20, A_21, and the inverted output of gate 57; the next circuit 55 from the left (in FIG. 4) receives bits A19, A_20, A_21, and the inverted output of gate 57; the next circuit 55 from the left receives bits A_19, A20, A_21, and the inverted output of gate 57; the next circuit 55 from the left receives bits A19, A20, A_21, and the inverted output of gate 57; the next circuit 55 from the left receives bits A_19, A_20, A21, and the inverted output of gate 57; the next circuit 55 from the left receives bits A19, A_20, A21, and the inverted output of gate 57; the next circuit 55 from the left receives bits A_19, A20, A21, and the inverted output of gate 57; the next circuit 55 from the left receives bits A19, A20, A21, and the inverted output of gate 57; the next circuit 55 from the left receives bits A_19, A_20, A_21, and the inverted output of gate 56; and the circuit 55 on the right side of FIG. 4 receives bits A19, A_20, A_21, and the inverted output of gate 56.

Each of circuits 54 receives the inverted output of a corresponding one of circuits 55 (at its "A0" terminal), and receives a different of one of the bits M(9:0) read from register 41 (at its "A1" terminal), and outputs a selected one of these two input bits in response to control bit C3 (and the inverse C3_of bit C3) in the manner described above with reference to FIG. 8 (except that control bits C3 and C3_are received, respectively, at terminals S1 and S0 of each FIG. 8 circuit embodying one of circuits 54 of FIG. 4, while bits C1 and C1_are received at terminals S1 and S0 of each FIG. 8 circuit embodying one of circuits 54 of FIG. 5 as described above with reference to FIG. 8). When the FIG. 4 circuit is controlled to output the bits M(9:0) by passing them through circuits 54, the FIG. 4 circuit effectively reads the bits M(9:0) from register 41 and asserts them to the array interface circuitry of the system.

Figure 7:
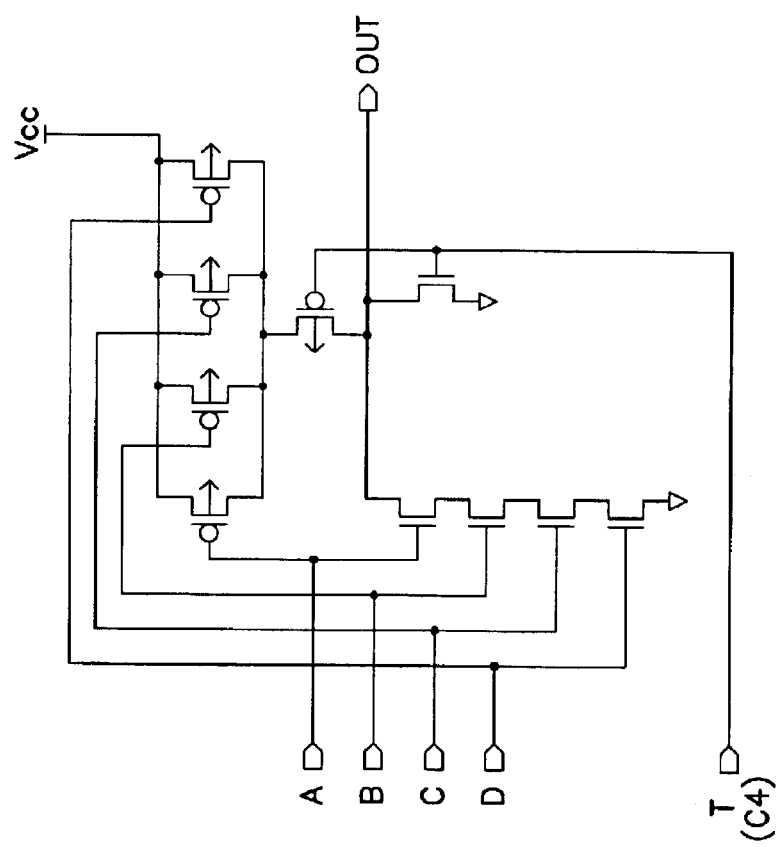
FIG. 7 is a schematic diagram of gate circuit 55 (CGATE3) of the FIG. 4 circuit.

FIG. 7 is a preferred implementation of circuit 55 of FIG. 4, which consists of ten transistors connected as shown in FIG. 7. With reference to FIGS. 4 and 7, each circuit 55 receives address bit A19 (or its inverse A_19) at its "A" terminal, address bit A20 (or its inverse A_20) at its "B" terminal, address bit A21 (or its inverse A 21) at its "C" terminal, the inverse of the output of gate 56 (or 57) at its "D" terminal, and control bit C4 at its "T" terminal. When C4 is low (and C5 is high), circuits 55 assert at their "Output" terminals the inverses of the output bits BS(9:0) which are specified in one of the first ten rows of Table B (each circuit 55 asserts a different one of the inverses of bits BS(9:0) in a row of Table B determined by the values of bits A(22:19)). Thus, the inverted outputs of circuits 55 pass through multiplexers 54, and thus the output bits BS(9:0) of circuit 50B are the bits specified in one of the first eight rows of Table A (where the row is determined by the values of bits A(22:19)).

When both of control bits C4 and C5 are low, the output of each of circuits 55 is high, and the inverted outputs of circuits 55 pass through multiplexers 54, and thus the output bits BS(9:0) of circuit 50B are all "low" bits (zeroes).

When control bit C4 is high, the output of each of circuits 55 is grounded (i.e., has a low level). When control bit C3 is low (while C4 is high), the inverses of the outputs of circuits 55 pass through multiplexers 54, and thus the output bits BS(9:0) of circuit SOB are all "high" bits (ones).

When control bit C3 is high, multiplexers 54 pass through bits M(9:0), regardless of the outputs of circuits 55, and thus the output bits BS(9:0) of circuit 50B are bits M(9:0).

In a typical write mode of operation of system 30 of FIG. 2, each set of address bits A(22:0) is associated with a data byte to be written to cells in a single row of one erase block (within one main block) of array 16, and each set of multiblock selection bits XC(7:0) and BS(9:0) is associated with cells in a row of each of two or more erase blocks (or main blocks), and the system writes the same data byte to multiple sets of cells (each set of cells in a different block) in response to each set of multiblock selection bits. The multiblock selection bits XC(7:0) and BS(9:0) determine each erase block and each main block to which the data byte is to be written. Address bits A(15:0) determine the line within each such erase block to which the data byte is to be written and the cells within each such line to which the data byte is to be written, and selection bits generated from address bits A(15:0) in circuits 12 and 13 select the line (within each target erase block in each target main block) to which the data byte is to be written and the cells within each such line to which the data byte is to be written.

In a typical read mode of operation of system 30 of FIG. 2, each set of address bits A(22:0) identifies cells in a single row of one erase block within one main block of array 16 from which a data byte is to be read, and each set of multiblock selection bits XC(7:0) and BS(9:0) identifies cells in a single row of each of two or more erase or main blocks of array 16 from which a data byte is to be read. If all the selected cells were programmed (so that they are all expected to conduct no more than negligible current when read by a sense amplifier), the system can simultaneously read data from multiple selected sets of cells (each set of selected cells in a different block) in response to each set of multiblock selection bits, in the sense that it can verify whether or not all the selected cells are in the expected (programmed) state. However, where each bitline extends through all the main blocks, and each sense amplifier in circuit 33 is coupled (during a read operation) to cells connected along one bitline, they system cannot distinguish between the case that one selected cell along a single bitline has changed state (from a programmed to an erased state), and the case that more that one selected cell along the bitline has changed state (from a programmed to an erased stat). In an alternative embodiment of FIG. 2 system in which each bitline is contained within a single main block, circuit 33 is implemented to include multiple blocks of sense amplifiers (each block including sense amplifiers for reading cells in a different main block), and each sense amplifier is coupled (during a read operation) to cells connected along one bitline within a single main block. Such multiple blocks of sense amplifiers could simultaneously read cells in two or more erase blocks of array 16 (where each of the erase blocks is in a different main block, and all the cells are simultaneously selected in accordance with the invention).

In any of the embodiments in the previous paragraph, multiblock selection bits XC(7:0) and BS(9:0) determine each erase block and each main block from which a data byte is to be read. Address bits A(15:0) determine the line within each such erase block from which a data byte is to be read and the cells within each such line from which the data byte is to be read, and selection bits generated from address bits A(15:0) in circuits 12 and 13 select the line (within each target erase block in each target main block) from which a data byte is to be read and the cells within each such line from which the data byte is to be read.

In a typical erase mode of operation (in a test mode) of system 30 of FIG. 2, address bits AX and A(15:0) select all cells of all rows, and multiblock selection bits XC(7:0) and BS(9:0) select a desired combination of at least two erase blocks (in a desired combination of one or more main blocks). The system simultaneously erases all cells in all selected erase blocks.

In either a read mode or a write mode of the system, predecoder 50 asserts a selected one of different sets of multiblock selection bits XC(7:0) and BS(9:0) in response each combination control bits C1, C2, C3, C4, and C5 that it receives from controller 129. For example, predecoder 50 asserts a set of multiblock selection bits (including a set of bits BS(9:0) consisting of nine bits having value "0" and one bit having value "1", and bits XC(7:0) having the following values: XC7=1, XC6=1, XC5=1, XC4=1, XC3=1, XC2=1, XC1=1, and XC0=1) which selects all erase blocks in a single main block in response to control bits having the following values: C1=0, C2=1, C3=0, C4=0, and C5=1. For another example, predecoder 50 asserts another set of multiblock selection bits (including a set of bits XC(7:0) consisting of seven bits having value "0" and one bit having value "1", and bits BS(9:0) having the following values: BS9=1, BS8=1, BS7=1, BS6=1, BS5=1, BS4=1, BS3=1, BS2=1, BS1=1, and BS0=1) which selects the same erase block in all main blocks, in response to control bits having the following values: C1=0, C2=0, C3=0, and C4=1. For another example, predecoder 50 asserts another set of multiblock selection bits (including bits XC(7:0) having the values XC7=1, XC6=1, XC5=1, XC4=1, XC3=1, XC2=1, XC1=1, and XC0=1, and bits BS(9:0) having the values BS9=1, BS8=1, BS7=1, BS6=1, BS5=1, BS4=1, BS3=1, BS2=1, BS1=1, and BS0=1) which selects all the erase blocks in all the main blocks, in response to control bits having the following values: C1=0, C2=1, C3=0, and C4=1.

In other examples, predecoder 50 asserts a set of multiblock selection bits (including a set of bits BS(9:0)=M(9:0) including two or more bits having value "1") which selects two or more main blocks in response to control bit C3 having the value C3=1. In other examples, predecoder 50 asserts a set of multiblock selection bits (including a set of bits XC(7:0)=E(7:0) including two or more bits having value "1") which selects two or more erase blocks in response to control bit C1 having the value C1=1.

Figure 9:
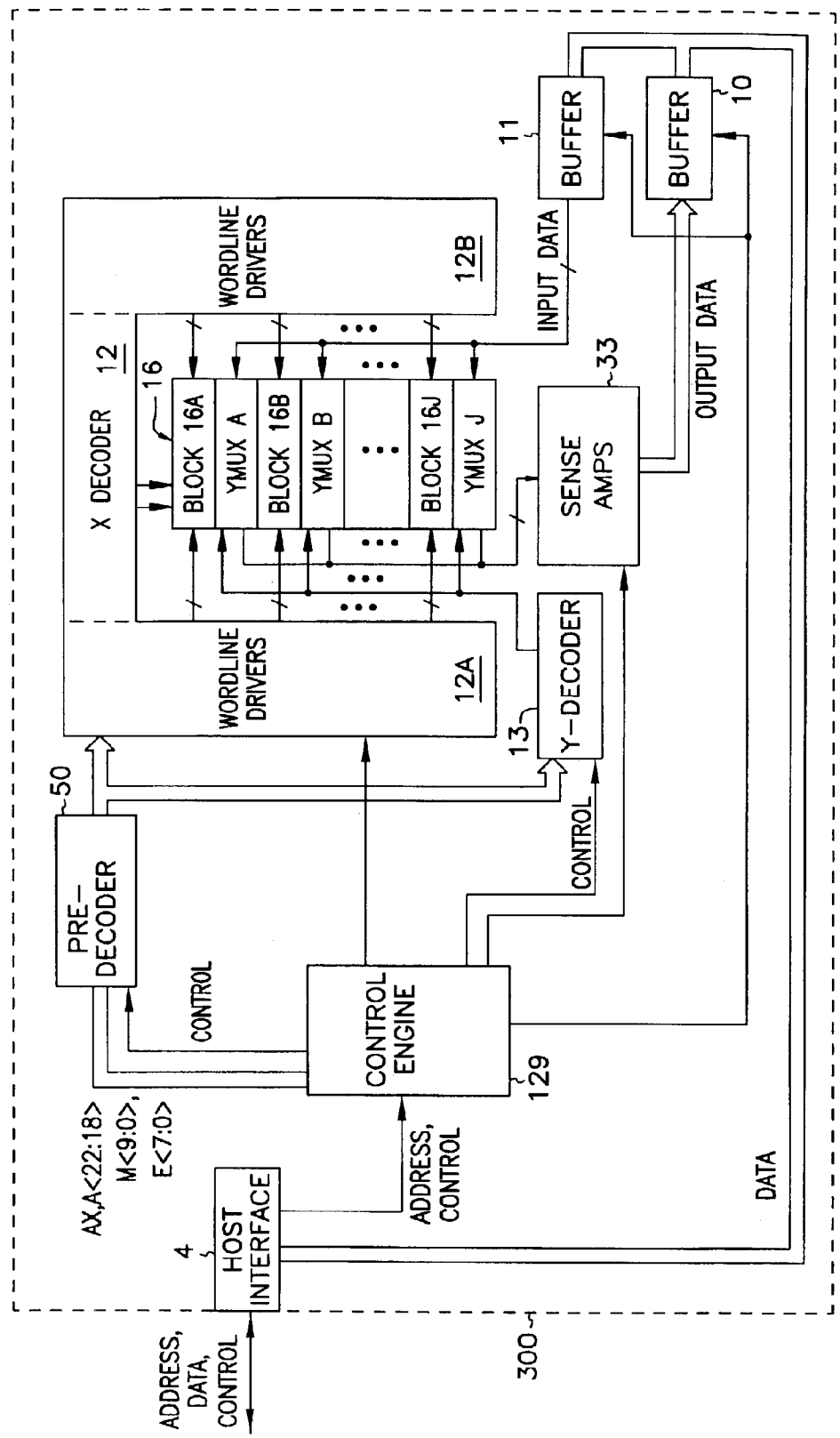
FIG. 9 is a block diagram of another preferred embodiment of the inventive flash memory system.

A variation on the FIG. 2 embodiment will next be described with reference to FIG. 9. System 300 of FIG. 9 is identical to system 30 of FIG. 2, except in that it lacks registers 40 and 41. In operation, control engine 129 can operate in a mode in which it sends address bits A(22:0) and AX to predecoder 50, and in response, predecoder 50 asserts single block selection bits to circuits 12 and 13 (to select one or more cells in a single selected erase block of array 16). In another mode of operation, control engine 129 sends address bits A(22:18) and AX and above-described bits M(9:0) and E(7:0) to predecoder 50. In response, predecoder asserts multiblock selection bits (including bits M(9:0) and E(7:0))

to circuits 12 and 13 (to select all cells of a selected combination of at least two erase blocks). System 300 then simultaneously erases all the cells of all the erase blocks determined by these multiblock selection bits.

The FIG. 9 embodiment thus operates in a mode in which address bits (bits A(17:0)) sent by controller 129 to predecoder 50 function as mask bits (bits M(9:0) and E(7:0)), to enable the system to implement simultaneous erasure of selected combinations of two or more erase blocks in accordance with the invention. In other modes of operation of the FIG. 9 system, the address bits A(17:0) sent by controller 129 to predecoder 50 function in a conventional manner as address bits for selecting an erase block, cylinder, sector, and cells within such sector.

Other aspects of the invention are methods (which can be implemented by the above-described memory system 30 or system 300, or variations thereon) which select at least one cell of each of two or more blocks of an array of memory cells organized in rows and columns.

One such method assumes that the rows are organized into N erase blocks of cells, where N is an integer, and includes the steps of:

(a) prestoring multiblock selection bits in M registers, wherein the registers store a total of no more then X of the multiblock selection bits, wherein M is an integer equal to at least one, and X is an integer less than N;

(b) reading the multiblock selection bits from at least one of the registers in response to control signals; and (c) simultaneously selecting a combination of blocks of the cells, in response to the multiblock selection bits.

In a class of embodiments of the method of the previous paragraph, step (b) includes the step of receiving a first set of Z multiblock selection bits from a first register (in which the Z bits have been prestored) and receiving a second set of Y multiblock selection bits from a second register (in which the Y bits have been prestored), and asserting the Z+Y=X received multiblock selection bits (where Z and Y are integers, for example Z=8 and Y=10). In some embodiments in this class, the first set of multiblock selection bits read from the first register determines an erase block in at least one main block of the array, and the second set of multiblock selection bits read from the second register determines at least one main block of the array.

Another embodiment of the inventive method is a method for selecting at least two blocks of cells of an array of memory cells, where the array is organized in rows and columns of the cells, including the steps of:

(a) generating multiblock selection bits by asserting control bits to a predecoder and processing the control bits in logic circuitry in the predecoder; and (b) simultaneously selecting a combination of the blocks of cells, in response to the multiblock selection bits.

In variations on this embodiment, step (a) includes the steps of generating a first subset of the set of multiblock selection bits by processing address bits in response to a first set of the control bits, and generating a second subset of the set of multiblock selection bits by processing a second set of the control bits in the logic circuitry. In other variations on this embodiment, step (a) includes the steps of reading a first subset of a set of multiblock selection bits from at least one register in response to a first set of the control bits, and generating a second subset of the set of the multiblock selection bits by processing a second set of the control bits in the logic circuitry.

Another embodiment of the inventive method is a method for selecting multiple blocks of cells of an array of memory cells, where the array is organized in rows and columns of the cells, including the steps of:

(a) asserting a first set of multiblock selection bits, in response to processing a first set of control bits in logic circuitry in a predecoder;

(b) selecting a first selected combination of blocks of the cells simultaneously, in response to the first set of multiblock selection bits;

(c) after step (a), asserting a second set of multiblock selection bits, in response to processing a second set of control bits in the logic circuitry; and (d) selecting a second selected combination of blocks of the cells simultaneously, in response to the second set of multiblock selection bits.

In some implementations of the embodiment of the previous paragraph, step (a) includes the steps of generating a first subset of the first set of multiblock selection bits by processing address bits in response to a first subset of the first set of control bits, and generating a second subset of the first set of multiblock selection bits by processing a second subset of the first set of control bits in the logic circuitry, and step (c) includes the steps of generating a first subset of the second set of multiblock selection bits by processing address bits in response to a first subset of the second set of control bits, and generating a second subset of the second set of multiblock selection bits by processing a second subset of the second set of control bits in the logic circuitry. In other implementations of the embodiment of the previous paragraph, step (a) includes the step of receiving at least one bit of the first set of multiblock selection bits from a register in which said at least one bit of the first set of multiblock address bits has been prestored, and step (c) includes the step of receiving at least one bit of the second set of multiblock address bits from a register in which said at least one bit of the second set of multiblock address bits has been prestored.

Another embodiment of the inventive method is a method for selecting multiple blocks of cells of an array of memory cells, where the array is organized in rows and columns of the cells, and the rows are organized into N erase blocks of the cells, where N is an integer, including the steps of:

(a) prestoring multiblock selection bits in M registers, wherein the registers store a total of no more then X of the multiblock selection bits, wherein M is an integer equal to at least one;

(b) asserting a first set of multiblock selection bits in response to a first set of control bits, including by reading at least a subset of the first set of multiblock selection bits from at least one of the registers;

(c) selecting a first selected combination of the erase blocks simultaneously, in response to the first set of multiblock selection bits;

(d) after step (b), asserting a second set of multiblock selection bits in response to a second set of control bits, including by reading at least a subset of the second set of multiblock selection bits from at least one of the registers; and (e) selecting a second selected combination of the erase blocks simultaneously, in response to the second set of multiblock selection bits.

Another embodiment of the inventive method is a method for writing data to multiple selected blocks of cells of an array of memory cells, where the array is organized in rows and columns of the cells, including the steps of:

(a) asserting multiblock selection bits in response to control bits by asserting control bits to a predecoder and processing the control bits in logic circuitry in the predecoder;

(b) selecting a combination of blocks of the cells simultaneously in response to the multiblock selection bits, and selecting at least one cell in each of the blocks in response to address bits; and (c) simultaneously writing a set of data bits to said at least one cell in said each of the blocks.

Another embodiment of the inventive method is a method for reading data from multiple selected blocks of cells of an array of memory cells, where the array is organized in rows and columns of the cells, including the steps of:

(a) asserting multiblock selection bits in response to control bits, by asserting control bits to a predecoder and processing the control bits in logic circuitry in the predecoder;

(b) selecting a combination of blocks of the cells simultaneously in response to the multiblock selection bits, and selecting at least one cell in each block of said combination of blocks in response to address bits; and (c) simultaneously reading data from said at least one cell in each block of said combination of blocks.

Another embodiment of the inventive method is a method for erasing multiple selected blocks of cells of an array of memory cells, where the array is organized in rows and columns of the cells, including the steps of:

(a) asserting multiblock selection bits in response to a first set of control bits, by asserting the first set of control bits to a predecoder and processing the first set of control bits in logic circuitry in the predecoder;

(b) selecting a combination of blocks of the cells simultaneously in response to the multiblock selection bits; and (c) simultaneously erasing all the blocks in said combination of blocks.

Preferred embodiments of the invention have been described with reference to FIGS. 2–9. Although these embodiments have been described in some detail, it is contemplated that changes from these embodiments can be made without departing from the spirit and scope of the invention as defined by the appended claims.

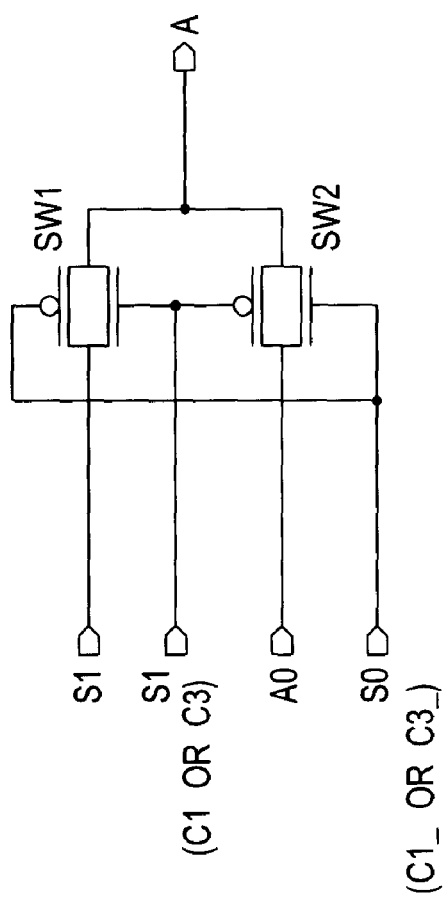

What is claimed is:

1. A memory system, comprising:

an array of memory cells;

array interface circuitry coupled to the array and configured to select one or more of the cells in response to selection bits;

a predecoder coupled to the array interface circuitry and responsive to control signals for asserting multiblock selection bits to the array interface circuitry so as to cause the array interface circuitry to select simultaneously at least one cell in each of a selected combination of blocks of the cells in response to the multiblock selection bits;

where the array is organized into main blocks of cells, each main block comprising multiple smaller blocks, and where the predecoder responds to a the control signals to activate a mode in which the predecoder selects all the multiple smaller blocks in a single one of the main blocks.

2. The system of claim 1 where the predecoder is responsive to the control signals to activate a mode in which the predecoder responds to address bits for asserting single-block selection bits to the array interface circuitry to cause the array interface circuitry to select at least one cell in only a single block of the memory cells.

3. The system of claim 1 further including a controller for loading replacement multiblock selection bits into the predecoder at desired times.

4. The system of claim 1 where the smaller blocks are erase blocks.

5. The system of claim 1 where the predecoder receives at least two subsets of the selection bits separately.

6. The system of claim 1 further comprising a control engine for receiving address bits and control signals, and for supplying at least some of the address bits to the predecoder as the selection bits in response to at least one of the control signals.

7. The system of claim 6 where the control engine supplies the at least some address bits as at least two separate groups of the selection bits.

8. The system of claim 7 where at least some of the address bits specify the at least one cell in each of the selected combination of blocks.

9. A memory system, comprising:

an array of non-volatile memory cells;

array interface circuitry coupled to the array and configured to select one or more of the cells in response to selection bits;

a predecoder coupled to the array interface circuitry and responsive to control signals for asserting multiblock selection bits to the array interface circuitry so as to cause the array interface circuitry to select simultaneously at least one cell in each of a selected combination of blocks of the cells in response to the multiblock selection bits;

where the array is organized into main blocks of cells, each main block comprising multiple erase blocks, and where the predecoder responds to a control signal to activate a mode in which it selects all the smaller blocks in a single one of the main blocks.

10. The system of claim 9 where the predecoder is responsive to the control signals to activate a mode in which the predecoder responds to address bits for asserting single-block selection bits to the array interface circuitry to cause the array interface circuitry to select at least one cell in only a single block of the cells.

11. The system of claim 9 further including a controller for loading replacement multiblock selection bits into the predecoder at desired times.

12. The system of claim 9 where the memory cells are flash memory cells.

13. The system of claim 9 further comprising a control engine for receiving address bits and control signals, and for supplying at least some of the address bits to the predecoder as the selection bits in response to at least one of the control signals.

14. The system of claim 13 where at least some of the address bits specify the at least one cell in each of the selected combination of blocks.

15. The system of claim 13, where one of the control signals commands the control engine to erase the at least one cell in each of the selected combination of blocks.

16. The system of claim 13 where one of the control signals commands the control engine to write data to the at least one cell in each of the selected combination of blocks.

17. The system of claim 13, where one of the control signals commands the control engine to read the at least one cell in each of the selected combination of blocks.

18. A memory system, comprising:

an array of memory cells;

array interface circuitry coupled to the array;

a host interface for receiving a plurality of address bits and control signals;

a control engine coupled to the host interface for translating at least some of the address bits into a plurality of separate groups of multiblock selection bits;

a predecoder coupled to the array interface circuitry and responsive to the control signals for asserting the multiblock selection bits to the array interface circuitry so as to cause the array interface circuitry to select simultaneously at least one cell, but fewer than all of the cells, in each of a selected combination of blocks of the cells in response to the multiblock selection bits.

19. The system of claim 18 where the multiblock selection bits comprise two groups.

20. The system of claim 18 where at least some of the address bits specify the at least one cell in the selected combination of blocks.

21. The system of claim 20 where at least some of the control signals determine which of the address bits specify the at least one cell.

22. The system of claim 20 where at least some of the control signals determine which of the address bits are translated to the multiblock selection bits.

23. The system of claim 22 where at least some of the control signals determine which of the address bits comprise each group of the multiblock selection bits.

24. The system of claim 18 where the predecoder is responsive to a control signal to activate a mode in which the predecoder responds to address bits for asserting single-block selection bits to the array interface circuitry to cause the array interface circuitry to select at least one cell in only a single block of the cells.

25. The system of claim 18 where the memory cells are non-volatile memory cells.

26. A method for simultaneously selecting at least two blocks of cells of an array of memory cells, the method comprising:

generating multiblock selections bits by asserting control bits to a predecoder and processing the control bits in logic circuitry in the predecoder; and simultaneously selecting a combination of blocks of the cells, in response to the multiblock selection bits, wherein generating the multiblock selections bits comprises:

reading a first subset of a set of the multiblock selection bits in response to a first set of the control bits; and generating a second subset of the set of the multiblock selection bits by processing a second set of the control bits in the logic circuitry.

27. The method of claim 26 further comprising addressing at least one memory cell in each of the blocks.

28. The method of claim 27 further comprising erasing the at least one memory cell in each of the blocks.

29. The method of claim 27 further comprising writing data to the at least one memory cell in each of the blocks.

30. The method of claim 27 further comprising reading data from the at least one memory cell in each of the blocks.

31. A method for simultaneously selecting at least two blocks of cells of an array of memory cells, the method comprising:

loading a plurality of address bits;

translating some of the bits into multiblock selection bits;

in response to a control signal, asserting the multiblock selection bits to array interface circuitry so as to cause the array interface circuitry to select simultaneously at least one cell, but fewer than all of the cells, in each of a selected combination of blocks of the cells in response to the multiblock selection bits.

32. A method for simultaneously selecting at least two blocks of cells of an array of memory cells, the method comprising:

loading a plurality of address bits;

translating some of the bits into multiblock selection bits;

in response to a control signal, asserting the multiblock selection bits to array interface circuitry so as to cause the array interface circuitry to select simultaneously at least one cell in each of a selected combination of blocks of the cells in response to the multiblock selection bits;

where the array is organized into main blocks of cells, each main block comprising multiple erase blocks, and further comprising selecting all the erase blocks in response to a further control signal.

33. The method of claim 32 further comprising, in response to a further control signal, activating a mode for asserting single-block selection bits to select at least one cell in only one block of the memory cells.

34. The method of claim 32 where the multiblock selection bits have independently settable bit positions for each of a plurality of blocks.

35. The method of claim 32 where at least some of the address bits specify at least one cell in each of the selected combination of blocks.

36. The method of claim 35 further comprising writing data to the at least one cell in each of the selected combination of blocks.

37. The method of claim 35 further comprising reading data from the at least one cell in each of the selected combination of blocks.

38. The method of claim 32 further comprising erasing the at least one cell in each of the selected combination of blocks.

39. A method for simultaneously selecting at least two blocks of cells of an array of memory cells, the method comprising:

loading a plurality of address bits;

converting some of the bits into a plurality of groups of multiblock selection bits;

in response to control signals, asserting the plurality of groups of the multiblock selection bits to array interface circuitry so as to cause the array interface circuitry to select simultaneously at least one cell, but fewer than all of the cells, in each of the blocks of the cells in response to the multiblock selection bits.

40. The method of claim 39 where at least some of the address bits specify the at least one cell in the selected combination of blocks.

41. The method of claims 40 where at least some of the control signals determine which of the address bits specify the at least one cell.

42. The method of claim 40 where at least some of the control signals determine which of the address bits are translated to the multiblock selection bits.

43. The method of claim 42 where at least some of the control signals determine which of the address bits comprise each group of the multiblock selection bits.

44. The method of claim 39 further comprising, in response to a further control signal, activating a mode for asserting single-block selection bits to select at least one cell in only one block of the memory cells.

45. The method of claim 39 where the memory cells are non-volatile memory cells.

46. A method for simultaneously selecting at least two blocks of cells of an array of non-volatile memory cells, the method comprising:

loading a plurality of address bits;

translating some of the bits into multiblock selection bits;

in response to a control signal, asserting the multiblock selection bits to array interface circuitry so as to cause the array interface circuitry to select simultaneously at least one cell, but fewer than all of the cells, in each of a selected combination of blocks of the cells in response to the multiblock selection bits.

47. A method for simultaneously selecting at least two blocks of cells of an array of non-volatile memory cells, the method comprising:

loading a plurality of address bits;

translating some of the bits into multiblock selection bits;

in response to a control signal, asserting the multiblock selection bits to array interface circuitry so as to cause the array interface circuitry to select simultaneously at least one cell in each of a selected combination of blocks of the cells in response to the multiblock selection bits;

where the array is organized into main blocks of cells, each main block comprising multiple erase blocks, and further comprising selecting all the erase blocks in response to a further control signal.

48. The method of claim 47 further comprising, in response to a further control signal, activating a mode for asserting single-block selection bits to select at least one cell in only one block of the memory cells.

49. The method of claim 47 further comprising erasing the at least one cell in the single block.

50. The method of claim 47 further comprising reading the at least one cell in the single block.

51. The method of claim 47 where at least some of the address bits specify at least one cell in each of the selected combination of blocks.

52. The method of claim 51 further comprising erasing the at least one cell in each of the selected combination of blocks.

53. The method of claim 51 further comprising reading data from the at least one cell in each of the selected combination of blocks.

* * * * *

UNITED STATES PATENT AND TRADEMARK OFFICE
CERTIFICATE OF CORRECTION

PATENT NO.      : 6,961,805 B2
DATED           : November 1, 2005
INVENTOR(S)     : Lakhani et al.

It is certified that error appears in the above-identified patent and that said Letters Patent is hereby corrected as shown below:

<u>Title page,</u>
Item [56], References Cited, U.S. PATENT DOCUMENTS,
"Hamaoto et al" reference, after "et al" insert -- . --.

<u>Drawings,</u>
Figure 8, below "S1" delete "(Cl" and insert -- (C1 --; and below "S0" delete "(_C1 OR_C3)" and insert -- (C1_ OR C3_) -- (as shown on the attached drawing sheet).

<u>Column 9,</u>
Line 26, delete "verytime-" and insert -- very time- --.

<u>Column 11,</u>
Line 57, delete "SOB" and insert -- 50B --.

<u>Column 12,</u>
Line 59, delete "SOB" and insert -- 50B --.

<u>Column 13,</u>
Line 28, after "C5)" insert -- , --.
Line 50, after "BS4=" insert -- 0 --.

<u>Column 15,</u>
Line 63, delete "503" and insert -- 50B --.

<u>Column 16,</u>
Line 58, after "inverse" delete "A 21" and insert -- A_21 --.

<u>Column 17,</u>
Line 12, delete "SOB" and insert -- 50B --.

<u>Column 21,</u>
Line 52, after "bits" delete ";" and insert -- , --.
Line 55, after "to" delete "a".

UNITED STATES PATENT AND TRADEMARK OFFICE
CERTIFICATE OF CORRECTION

PATENT NO. : 6,961,805 B2
DATED : November 1, 2005
INVENTOR(S) : Lakhani et al.

It is certified that error appears in the above-identified patent and that said Letters Patent is hereby corrected as shown below:

Column 22,
Line 26, after "bits" delete ";" and insert -- , --.
Lines 51 and 57, after "13" delete ",".

Column 23,
Line 9, delete "comprise" and insert -- comprises --.
Lines 34 and 40, delete "selections" and insert -- selection --.
Line 43, after "control bits" delete ";" and insert -- , --.

Column 24,
Line 12, after "bits" delete ";" and insert -- , --.
Line 53, delete "claims" and insert -- claim --.

Column 25,
Line 23, after "bits" delete ";" and insert -- , --.

Signed and Sealed this

Sixth Day of June, 2006

JON W. DUDAS
*Director of the United States Patent and Trademark Office*